United States Patent
Mitsuhashi et al.

(10) Patent No.: US 6,490,497 B1
(45) Date of Patent: Dec. 3, 2002

(54) WORKING PROCESS END POINT REAL TIME DETERMINATION METHOD

(75) Inventors: Hideo Mitsuhashi, Toyko (JP); Katsuhisa Okawa, Tokyo (JP); Hiroshi Naka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/489,033

(22) Filed: Jan. 21, 2000

(30) Foreign Application Priority Data

Jan. 22, 1999 (JP) .......................................... 11-014864
Nov. 5, 1999 (JP) .......................................... 11-315808

(51) Int. Cl.[7] .......................... G06F 19/00; G05B 13/02; H01L 21/00; H01L 21/302
(52) U.S. Cl. .......................... 700/121; 700/33; 700/71; 438/5; 438/7; 438/691
(58) Field of Search .............................. 700/33, 35, 52, 700/54, 71–73, 121, 164, 172; 438/5, 7, 691, 692, 8

(56) References Cited

U.S. PATENT DOCUMENTS

| | | | |
|---|---|---|---|
| 5,503,707 A | * | 4/1996 | Maung et al. ................. 427/10 |
| 5,851,846 A | * | 12/1998 | Matsui et al. ................. 216/52 |
| 6,028,669 A | * | 2/2000 | Tzeng ........................ 356/504 |
| 6,190,927 B1 | * | 2/2001 | Liu ........................ 204/192.23 |
| 6,218,313 B1 | * | 4/2001 | Tomita et al. ................. 438/16 |
| 6,361,646 B1 | * | 3/2002 | Bibby et al. ................... 216/85 |
| 6,406,641 B1 | * | 6/2002 | Golzarian ..................... 216/85 |

FOREIGN PATENT DOCUMENTS

| | | |
|---|---|---|
| JP | 2561812 | 9/1996 |
| JP | 2000-40680 | 2/2000 |

* cited by examiner

Primary Examiner—Leo Picard
Assistant Examiner—Elliot Frank
(74) Attorney, Agent, or Firm—Whitham, Curtis & Christofferson, P.C.

(57) ABSTRACT

A working process end point real time determination method by which a working process end point can be determined accurately without an error even if a working process measurement signal has such a great variation that; the variation cannot be removed fully from and still remains in resulting smoothed data is disclosed. In the method, a working process end point is estimated by extrapolation from the variation of the average gradient of the averaged data in a predetermined period of the working process measurement signal to perform determination of the end point. Where the working process does not allow such extrapolation, it is first determined that the working process is near the working process end point based on the absolute value of the average gradient of the averaged data, and then the working process end point is determined using a short time gradient calculated from a value at the present measurement point of time and another value in the nearest past of the averaged data of the working process measurement signal.

74 Claims, 19 Drawing Sheets

WORKING PROCESS END POINT REAL TIME DETERMINATION METHOD

BACKGROUND OF THE INVENTION

1. Field of the Invention

The present invention relates to a working process end point real time determination method for determining an end point of a working process on a real time basis while the working process is proceeding using a working process measurement signal which exhibits, as the working process proceeds, a great increase or decrease once while including variations and then enters steady state as the working process comes to an end.

2. Description of the Related Art

Some working process apparatus such as a semiconductor process apparatus includes a working process measuring instrument for monitoring the progress of a working process.

One of working process measurement signals obtained from a working process measuring instrument exhibits such a variation with respect to time that it exhibits a great increase or decrease once as a working process proceeds after the lapse of a fixed period of time after the working process is started, and then enters a steady state as the predetermined working process is completed. The steady state in this instance signifies a state wherein the signal exhibits little variation, and more specifically signifies a state wherein the variation amount of the signal per unit time has a very low value close to zero.

The working process measurement signal includes periodical variations because a measurement position is scanned in a fixed cycle or, although the measurement position is fixed, the working process side includes a periodical operation from such a reason that the procedure of the working process involves some irregularity depending upon the spatial position and so forth, and the progress of the working process appears on a signal variation from which the periodical variations are removed. Accordingly, the determination that the working process comes to an end determines a point at which the working process measurement signal completes entrance into a steady state from the condition wherein it includes variations.

Though not particularly shown in the accompanying drawings, in order to determine a process end point from a working process measurement signal which exhibits such a variation as described above, a method is generally used wherein the point of time at which the working process measurement signal exhibits a variation to a value equal to or lower than a predetermined value or a value equal to or higher than a predetermined value is determined as a working process end point.

More particularly, since the working process measurement signal exhibits an increase or a decrease once and then enters a steady state, the working process measurement signal is compared with a predetermined threshold value set in advance, and the point of time at which the working process measurement signal exhibits a change to a value equal to or higher than the threshold value or equal to or lower than the threshold value is determined as a working process end point. The method can be applied to working processing end point determination in a CMP process for performing chemical and mechanical polishing (CMP) of a semiconductor wafer.

FIG. 7 is a cross sectional view showing an example of a semiconductor wafer (hereinafter referred to simply as wafer) which is a working object (polishing object). Referring to FIG. 7, the wafer generally denoted at 1 includes a substrate 4 having a high reflection factor with respect to inspection light, an insulator layer 2 applied to the surface of the substrate 4 and having a low reflection factor with respect to the inspection light or transparent to the inspection light, and a metal layer 3 having a high reflection factor with respect to the inspection light and applied to the entire face of the insulator layer 2 in such a manner that it covers over the insulator layer 2. In a CMP process, the metal layer 3 is polished by a CMP apparatus until the insulator layer 2 is exposed to form metal wiring lines. Accordingly, the point of time at which the metal wiring lines are formed completely is the polishing end point.

An example of an application to such a CMP process as just described is disclosed in Japanese Patent No. 2, 561, 812. The method is illustrated in a flow chart of FIG. 19. Referring to FIG. 19, the working process end point real time determination method illustrated includes a first step A1 and a second step A2. In the first step A1, an average value after each predetermined interval of time of a reflected light amount measured by a polished condition monitoring apparatus of the reflected light amount measurement type is calculated as measured light amount averaged data. Then, in the second step A2, the measured light amount averaged data calculated in the first step A1 is compared with a predetermined threshold value which depends upon the reflection factor of a material formed on the wafer with respect to inspection light and the structure of the wafer such as a pattern density, and the point of time at which the measured light amount averaged data becomes a value lower then the threshold value is determined as the polishing end point.

The measured light amount averaged data calculated in the first step A1 exhibits the following variation with respect to time. In particular, in an initial stage of polishing, since the metal layer 3 having a high reflection factor with respect to the inspection light is applied to the overall area of the uppermost layer of the wafer 1 as seen in FIG. 7, the measured light amount averaged data exhibits a high value. Then, as the polishing proceeds, the metal layer 3 is removed, and the insulator layer 2 having a low reflection factor with respect to the inspection light is exposed and begins to be polished. Or, where the insulator layer 2 is transparent to the inspection light, the inspection light begins to pass through the insulator layer 2 thus exposed and is reflected by the substrate 4 having a low reflection factor. Consequently, the reflected light amount gradually decreases. As the polishing further proceeds, metal wiring lines are finally formed completely. Consequently, even if the polishing thereafter proceeds, the area ratio between the insulator layer 2 and the metal layer 3 does not exhibit a variation any more, and accordingly, the measured light amount averaged data does not vary any more and exhibits a fixed value.

Accordingly, since the point of time at which the metal wiring lines are formed completely is the polishing end point, the point at which the measured light amount averaged data does not exhibit a variation any more but exhibits a fixed value indicates the polishing end point.

The measured light amount averaged data at the point of time of the end of the polishing exhibits the same value for each wafer if the reflection factor of the material formed on the wafer with respect to the inspection light and the structure of the wafer such as the pattern density are the same.

Therefore, in the second step A2, the measured light amount averaged data calculated in the first step A1 is compared with a predetermined threshold value which depends upon the reflection factor of a material formed on the wafer with respect to the inspection light and the structure of the wafer such as a pattern density, and the point of time at which the measured light amount averaged data becomes a value lower then the threshold value is determined as the polishing end point.

However, the conventional method wherein a measured light amount averaged data is compared with a predetermined threshold value to determine a working process end point has a problem in that, where the working process measurement signal exhibits a great variation, the determination of the working process end point cannot be performed with a high degree of accuracy.

Where the variation of the working process measurement signal is great, the working process measurement signal cannot be smoothed sufficiently unless the time interval upon averaging of the signal is sufficiently great. In the conventional method illustrated in FIG. 19, the working process measurement signal cannot be smoothed sufficiently unless the time interval when the reflected light amount is averaged in the first step A1 is great.

However, if the time interval for the averaging is increased, then the measurement signal smoothed data includes a greater amount of influence of data in the past and a delay is produced in the variation of the same. Consequently, a delay is produced in the determination of the working process end point. In this instance, according to the conventional method illustrated in FIG. 19, the determination of the polishing end point is delayed, and this gives rise to excessive polishing.

On the other hand, if the time interval for the averaging is decreased in order to prevent the delay, the variation cannot be smoothed sufficiently, and consequently, the determination accuracy of the working process end point is deteriorated. In this instance, according to the conventional method illustrated in FIG. 19, the determination of the polishing end point is dispersed, which gives rise to shortage of the polishing amount or excessive polishing.

SUMMARY OF THE INVENTION

It is an object of the present invention to provide a working process end point real time determination method by which the working process end point can be determined with a high degree of accuracy without an error even if a working process measurement signal has such a great variation that, even if it is smoothed, the variation cannot be removed fully from and still remains in resulting measurement signal smoothed data.

In order to attain the object described above, in a working process end point real time determination method according to a first aspect of the present invention, from a working process measurement signal which indicates the progress of a working process and exhibits a fluctuation, a point of time at which transition of the working process measurement signal into a steady state is completed after the working process measurement signal experiences a great variation once as the working process proceeds is determined on the real time basis while the working process is proceeding.

The working process measurement signal is obtained from a working process measuring instrument and includes a periodical variation because a measurement position is scanned in a fixed cycle or, although the measurement position is fixed, the working process side includes a periodical operation from such a reason that the procedure of the working process involves some irregularity depending upon the spatial position and so forth. Since the progress of the working process appears on a signal variation from which the periodical variation has been removed, in the first step, averaging is performed at intervals equal to an integral number of times the period of the variation to discretely calculate averaged data for each interval equal to the integral number of times the predetermined period.

Because the initial state prior to the working process is not fixed, the working process measurement signal in an initial stage of the working process exhibits a different variation from the procedure of the working process even if the periodical variation is removed from the working process measurement signal in the first step. The variation of the working process measurement signal in an initial stage of the working process is different among different working processes and may sometimes be a very great variation. Therefore, in the second step, end point determination based on the working process measurement signal is not performed for a time which exceeds the time within which such a variation of the working process measurement signal as described above may possibly occur.

Further, in order to cope with a dispersion of the initial variation period of the working process measurement signal which arises from a dispersion of the rate of the working process, in the third step, end point determination based on the working process measurement signal is not performed before the working process measurement signal exhibits a great variation as the working process proceeds, for example, before the working process measurement signal reaches a predetermined value or a predetermined multiple.

Then, determination of the working process end point is performed. However, even if the working process measurement signal is averaged to remove a periodical variation in the first step, the averaged data of the working process measurement signal obtained in the first step still includes remaining noise components originating from irregularity of the working process, the accuracy of a measuring apparatus or mixture of noise. Accordingly, transition of the working process to a steady state cannot be determined from the fact that the gradient (differential value) of the averaged data of the working process measurement signal at the present measurement point of time comes to the proximity of 0, but, for the determination of the working process end point, it is necessary to use data whose noise components have been smoothed sufficiently.

Therefore, in the fourth step, as such smoothing processing, it is possible to calculate an average value of a plurality of ones of the averaged data of the working process measurement signal obtained in the first step which belong to a predetermined period in the past including the value of the averaged data at the present measurement point of time and an average value of another plurality of ones of the averaged data which belong to another predetermined period in the further past and calculate a variation amount between the two average values as an average gradient.

However, if the point of time at which the average gradient obtained in the fourth step comes to the proximity of 0 is detected to determine the working process end point, then since a time delay caused by use of the data in the past is involved in the average gradient, the working process end determination is delayed.

Therefore, in the fifth step, after an absolute value of the average gradient of the averaged data of the working process measurement signal assumes a value equal to or higher than a predetermined value, the average gradient value at the present measurement point of time and another one of the average gradient values in the near past are joined to perform extrapolation to the future to calculate an estimated value of a time at which the average gradient is estimated to become equal to 0 and the working process comes to an end.

In this instance, since the estimated value of the time includes some delay in time caused by use of the data in the past, in the sixth step, the delay time is subtracted from the estimated value up to the end of the working process, and it is temporarily determined that the working process has come to an end if the working process time obtained by the subtraction indicates a time prior to the present measurement point of time.

The estimated value of the time up to the end of the working process includes some error caused by mixture of noise and so forth and the error makes a factor of wrong determination. Therefore, in the seventh step, overlooking some error, a short time gradient of the averaged data of the working process measurement signal is calculated only from the value at the present measurement point of time and the value in the nearest past from within the averaged data of the working process measurement signal calculated in the first step, and it is determined that the working process has come to an end from a logical AND between when the short time gradient reaches a value within a predetermined range successively more than a predetermined number of times, that the short time gradient exhibits a value within the predetermined range totally by more than the predetermined number of times after the absolute value of the average gradient assumes a value equal to or higher than the predetermined value or that the ratio at which the short time gradient assumes a value within the predetermined range is equal to or higher than a predetermined ratio and a result of the determination in the sixth step that a time obtained by subtracting the delay time caused by use of the data in the past from the estimated value up to the end of the working process indicates a time prior to the present measurement point of time.

Where the working process end point real time determination method is applied to a working process with which there is no sufficient time margin in which estimation by extrapolation of a working process end point is to be performed because average data of a working process measurement signal exhibits a sudden variation at the working process end point from a characteristic of a working process object article or a working process apparatus or extrapolation cannot be performed because the manner of the variation with respect to time of the averaged data of the working process measurement signal is different among different working processes, after it is determined that the working process at present is in the proximity of the working process end point from the fact that the absolute value of the average gradient of the averaged data of the working process measurement signal assumes a value equal to or higher than the predetermined value, a short time gradient of the averaged data of the working process measurement signal is calculated only from a value at the present measurement point of time and another value in the nearest past from within the averaged data of the working process measurement signal, and then it is determined that the working process has come to an end if the short time gradient reaches a value within a predetermined range successively more than a predetermined number of times, if the short time gradient exhibits a value within the predetermined range totally by more than the predetermined number of times after the absolute value of the average gradient assumes a value equal to or higher than the predetermined value or if the ratio at which the short time gradient assumes a value within the predetermined range is equal to or higher than a predetermined ratio.

According to a second aspect of the present invention, there is provided a working process end point real time determination method which comprises the first to fourth steps described above and further comprises, next to the fourth step, an eighth step of waiting for an absolute value of the average gradient of the averaged data of the working process measurement signal calculated in the fourth step to become equal to or higher than a first threshold value set in advance, and a ninth step of calculating a short time gradient of the averaged data of the working process measurement signal only from the value at the present measurement point of time and the value in the nearest past of the averaged data of the working process measurement signal calculated in the first step after the absolute value of the average gradient of the averaged data of the working process measurement signal calculated in the fourth step to become equal to or higher than the first threshold value and determining that the working process has come to an end if the short time gradient reaches a value within a second threshold value set in advance successively more than a predetermined number of times, if the short time gradient assumes a value within the second threshold value totally by more than the predetermined number of times after the absolute value of the average gradient becomes equal to or higher than the first threshold value or if the ratio at which the short time gradient assumes a value within the second threshold value is equal to or higher than a predetermined ratio.

According to a third aspect of the present invention, there is provided a working process end point real time determination method which comprises the first to fourth steps described above and further comprises, next to the fourth step, a 23rd step of multiplying a maximum value, a minimum value or an average value of the averaged data obtained for a time between a point of time when a fixed time for excepting a signal variation in an initial stage of the working process elapses and another point of time when the working process measurement signal begins a great variation by different predetermined values to calculate relative values as first and second threshold values, a 24th step of joining the average gradient value at the present measurement point of time and another one of the average gradient values in the near past after a point of time when an absolute value of the average gradient of the averaged data becomes equal to or higher than the first threshold value to perform extrapolation to the future to calculate a time at which the average gradient becomes equal to zero in the future as an estimated value of a working process end time, a 25th step of subtracting a delay time caused by use of the data in the past from the estimated value of the working process end time and temporarily determining that the working process has come to an end if the time obtained by the subtraction indicates a time prior to the present measurement point of time, and a 26th step of calculating a short time gradient of the averaged data only from a value of the averaged data at the present measurement point of time and another value of the averaged data in the nearest past and determining that the working process has come to an end from a logical AND between that the short time gradient assumes a value within the second threshold value successively more than a predetermined number of times, that the short time gradient assumes a value within the second threshold value totally by more than the predetermined number of times after the absolute value of the average gradient assumes a value equal to or higher than the first threshold value or that the ratio at which the short time gradient assumes a value within the second threshold value exceeds a predetermined ratio and the determination result in the 25th step.

The estimated value of the time before the working process end point includes an error originating from noise and so forth mixed thereto, and the error makes a factor of wrong determination. Therefore, in the 26th step, taking it into consideration that some error is involved, a short time gradient of the averaged data of the working process measurement signal is calculated only from a value of the averaged data of the working process measurement signal at the present measurement point of time calculated in the first step and another value of the averaged data in the nearest past, and it is determined that the working process has come to an end from a logical AND between that the short time gradient assumes a value within the second threshold value successively more than a predetermined number of times, that the short time gradient assumes a value within the second threshold value totally by more than the predetermined number of times after the absolute value of the average gradient assumes a value equal to or higher than the first threshold value or that the ratio at which the short time gradient assumes a value within the second threshold value exceeds a predetermined ratio and that the time obtained by subtracting a delay time caused by use of the data in the past from the estimated value of the working process end time is prior to the present measurement point of time.

The first and second threshold values to be used in the 24th and 26th steps are calculated as relative values in the 23rd step by multiplying a maximum value, a minimum value or an average value of the averaged data of the working process measurement signal obtained for a time between a point of time when a fixed time for excepting a signal variation in an initial stage of the working process elapses in the second step and another point of time when the working process measurement signal begins a great variation by different predetermined values.

Since the end point determination based on the working process measurement signal is not performed until the working process measurement signal reaches a predetermined multiple in the third step and besides the threshold values are formed from relative values, even if the magnitude of the working process measurement signal varies generally depending upon a difference in the working object article, the process condition or the measurement condition or the like, the working process end point can be determined correctly.

It is to be noted that, in such a process that the working process measurement signal exhibits little variation in overall magnitude, the threshold values may be formed as fixed values.

When it is determined in the 26th step that the short time gradient exhibits a value within the predetermined threshold value totally by more than the predetermined number of times after the absolute value of the average gradient exhibits a maximum value, if the absolute value of the average gradient assumes a maximum value by a plurality of times before the working process comes to an end, then each time a maximum value is detected, the total number of times is reset to re-start counting.

Where the working process end point real time determination method is applied to a working process with which there is no sufficient time margin in which estimation by extrapolation of a working process end point is to be performed because average data of a working process measurement signal exhibits a sudden variation at the working process end point from a characteristic of a working process object article or a working process apparatus or extrapolation cannot be performed because the manner of the variation with respect to time of the averaged data of the working process measurement signal is different among different working processes, it is first determined that the working process at present is in the proximity of the working process end point from the fact that the absolute value of the average gradient of the averaged data of the working process measurement signal assumes a value equal to or higher than the predetermined threshold value. Then, a short time gradient of the averaged data of the working process measurement signal is calculated only from a value at the present measurement point of time and another value in the nearest past from within the averaged data of the working process measurement signal, and then it is determined that the working process has come to an end if the short time gradient reaches a value within a predetermined threshold value successively more than a predetermined number of times, if the short time gradient exhibits a value within the predetermined range totally by more than the predetermined number of times after the absolute value of the average gradient assumes a value equal to or higher than the predetermined threshold value or if the ratio at which the short time gradient assumes a value within the predetermined threshold value is equal to or higher than a predetermined ratio.

According to a fourth aspect of the present invention, there is provided a working process end point real time determination method which comprises the first to fourth steps and the eighth and ninth steps described above and further comprises, prior to the eighth step, a 23rd step of multiplying a maximum value, a minimum value or an average value of the averaged data obtained for a time between a point of time when a fixed time for excepting a signal variation in an initial stage of the working process elapses and another point of time when the working process measurement signal begins a great variation by different predetermined values to calculate relative values as first and second threshold values.

Each of the working process end point real time determination methods according to the first to fourth aspects of the present invention may be constructed in the following manner.

In the first step of averaging a working process measurement signal at intervals equal to an integral number of times a predetermined period to discretely calculate an average value for each interval equal to the integral number of times the predetermined period as averaged data, the working process measurement signal may be averaged after each time interval within which a working object makes one rotation.

In the first step of averaging a working process measurement signal at intervals equal to an integral number of times a predetermined period to discretely calculate an average value for each interval equal to the integral number of times the predetermined period as averaged data, the working process measurement signal may be averaged after each time interval within which a working object makes an integral number of rotations.

In the first step of averaging a working process measurement signal at intervals equal to an integral number of times a predetermined period to discretely calculate an average value for each interval equal to the integral number of times the predetermined period as averaged data, the averaging of the working process measurement signal only over a predetermined interval of time within a time within which a working object makes one rotation may be performed after each period of rotation of the working object.

In the first step of averaging a working process measurement signal at intervals equal to an integral number of times a predetermined period to discretely calculate an average value for each interval equal to the integral number of times the predetermined period as averaged data, the working process measurement signal may be averaged at time intervals within which inspection light scans a working object.

In the fourth step of calculating an average gradient over a plurality of ones of the averaged data of the working process measurement signal which belong to a predetermined period in the past including the value of the averaged data at the present measurement point of time, an average value of a plurality of ones of the averaged data which belong to a predetermined period in the past including the value of the averaged data at the present measurement point of time and an average value of another plurality of ones of the averaged data which belong to another predetermined period in the further past may be calculated, and a variation amount per unit time between the two average values may be calculated as the average gradient.

In the fourth step of calculating an average gradient over a plurality of ones of the averaged data of the working process measurement signal which belong to a predetermined period in the past including the value of the averaged data at the present measurement point of time, an expression of a straight line may be determined by a least square approximation method using a plurality of averaged data of a measured light amount which belong to a predetermined period in the past including a value of the measured light amount averaged data at the present measurement point of time, and a gradient of the straight line may be calculated as the average gradient.

In the fifth step of joining the average gradient at the present measurement point of time and another one of the average gradients in the near past to perform extrapolation to the future to calculate an estimated value of time until the working process comes to an end, an expression of a straight line which passes two points of the average gradient of the average gradient data at the present measurement point of time and another average gradient immediately preceding to the same may be determined, and a time at which the average gradient becomes equal to 0 may be calculated from the expression of the straight line only when the gradient of the straight line determined is in the positive if the averaged data exhibits a variation with respect to time wherein the averaged data drops by a great amount once and then enters a steady state or only when the gradient of the straight line determined is in the negative if the averaged data exhibits another variation with respect to time wherein the averaged data rises by a great amount once and then enters a steady state.

In the fifth step of joining the average gradient at the present measurement point of time and another one of the average gradients in the near past to perform extrapolation to the future to calculate an estimated value of time until the working process comes to an end, an expression of a straight line may be determined by a least square approximation method using three or more average gradients of the averaged data which belong to the past including the average gradient of the average gradient data at the present measurement point of time, and a time at which the average gradient becomes equal to 0 may be calculated from the expression of the straight line only when the gradient of the straight line determined is in the positive if the averaged data exhibits a variation with respect to time wherein the averaged data drops by a great amount once and then enters a steady state or only when the gradient of the straight line determined is in the negative if the averaged data exhibits another variation with respect to time wherein the averaged data rises by a great amount once and then enters a steady state.

An average gradient in a short time including a comparatively small number of averaged data in the past may be calculated and the number of times by which the average gradient in the short time assumes a value equal to or greater than 0 may be counted, and it may be determined that the working end point comes if the end point determination time calculated by such a method as described above is smaller than the present working time and the count number by which the relationship that the average gradient in the short time is equal to or greater than 0 is satisfied is equal to or greater than a predetermined number.

A predetermined time which exceeds a time within which a great variation of the averaged data in an initial stage of the working occurs may be set in advance, and the predetermined time and the working elapsed time till the present may be compared with each other and then the working end point determination operation is not performed until the present working elapsed time becomes equal to or greater than the predetermined time set in advance.

A maximum value of the averaged data till the present measurement point of time may be determined, and the working end point determination operation is not performed until it is determined, when the averaged data drops by a predetermined ratio from the maximum value, that a drop of the averaged data which is a characteristic of the averaged data in the proximity of the working end point has started.

When the end point determination time is to be calculated, a time obtained by adding or subtracting a predetermined time to or from a working time till the present since the oldest point of time in the past used for the calculation of the average gradient may be subtracted from a time at which the average gradient assumes a value equal to 0 to calculate the end point determination time thereby to delay or advance the determination of the working end point by a predetermined time.

Preferably, the threshold values are calculated as relative values by multiplying a maximum value, a minimum value or an average value of the averaged data of the working process measurement signal obtained for a time between a point of time when a fixed time for excepting a signal variation in an initial stage of the working process elapses and another point of time when the working process measurement signal begins a great variation by different predetermined values.

Since the threshold values are formed from relative values, even if the magnitude of the working process measurement signal is varied generally by a difference in a working object, a process condition, a measurement condition or the like, the effect that determination of the working process end point can be performed appropriately can be achieved.

Preferably, when it is determined that the short time gradient exhibits a value within the predetermined threshold value totally by more than the predetermined number of times after the absolute value of the average gradient exhibits a maximum value, in such a process that the absolute value of the average gradient assumes a maximum value by a plurality of times before the working process comes to an end, each time a maximum value is detected, the total number of times is reset to re-start counting.

Where the present invention is applied to a CMP apparatus which performs chemical and mechanical polishing of a semiconductor wafer, since the working object is a wafer, the working process end point real time determination method is preferably constructed in the following manner.

In particular, the working process end point real time determination method comprises a tenth step of calculating, as measured light amount averaged data, an average value after each predetermined interval of time of a reflected light amount measured by a polished condition monitoring apparatus of the reflected light amount measurement type mounted on the CMP apparatus for irradiating inspection light upon a polished face of the semiconductor wafer and monitoring a polished condition from a variation of the reflected light amount obtained then, an eleventh step of calculating, as average gradient data, an average rate of change over a plurality of measured light amount averaged data which belong to a predetermined period in the past including the value at the present measurement point of time of the measured light amount averaged data calculated in the tenth step, a twelfth step of joining, after an absolute value of the average gradient of the measured light amount averaged data calculated in the eleventh step assumes a value equal to or higher than a predetermined value, the average gradient at the present measurement point of time and another one of the average gradients in the near past to perform extrapolation to the future to estimate and calculate a time at which the relationship that the average gradient is equal to 0 is reached, a thirteenth step of subtracting a polishing time till the present since the oldest point of time in the past used for calculation of the average gradient in the eleventh step from the time at which the relationship that the average gradient is equal to 0 is reached to calculate an end point determination time, and a fourteenth step of comparing the end point determination time calculated in the thirteenth step and the present polishing time with each other and determining a point of time at which the end point determination time becomes equal to or smaller than the present polishing time as a polishing end point.

Alternatively, the working process end point real time determination method may comprise a tenth step of calculating, as measured light amount averaged data, an average value after each predetermined interval of time of a reflected light amount measured by a polished condition monitoring apparatus mounted on a CMP apparatus for performing chemical and mechanical polishing of a semiconductor wafer, an eleventh step of calculating, as average gradient data, an average rate of change over a plurality of measured light amount averaged data which belong to a predetermined period in the past including the value at the present measurement point of time of the measured light amount averaged data calculated in the tenth step, a twelfth step of joining, after an absolute value of the average gradient of the measured light amount averaged data calculated in the eleventh step assumes a value equal to or higher than a predetermined value, the average gradient at the present measurement point of time and another one of the average gradients in the near past to perform extrapolation to the future to estimate and calculate a time at which the relationship that the average gradient is equal to 0 is reached, a thirteenth step of subtracting a polishing time till the present since the oldest point of time in the past used for calculation of the average gradient in the eleventh step from the time at which the relationship that the average gradient is equal to 0 is reached to calculate an end point determination time, a 31st step of multiplying a maximum value or an average value of the measured light amount averaged data obtained for a time after a fixed time for excepting a signal variation in an initial stage of the polishing elapses until the measured light amount averaged data begins to drop a great amount by a predetermined value to calculate a relative value as a threshold value, a 32nd step of calculating a first average value of a plurality of ones of the measured light amount averaged data which belong to a predetermined period in the past including the value of the measured light amount averaged data at the present measurement point of time and a second average value of another plurality of ones of the measured light amount averaged data which belong to another predetermined period in the further past and calculating a variation amount per unit time between the first and second average values as an average gradient in a short time, a 33rd step of detecting that the average gradient data calculated in the eleventh step assumes a minimum value, a 34th step of counting an accumulated value of the number of times by which the average gradient data in the short time calculated in the 32nd step assumes a value equal to or higher than the counter threshold value after it is determined that the average gradient data calculated in the eleventh step assumes a minimum value, a 35th step of resetting, if the average gradient data calculated in the eleventh step assumes a maximum value after it is determined in the 33rd step that the average gradient data assumes a minimum value, the accumulated value counted in the 34th step and repeating the minimum value detection in the 33rd step, and a 36th step of comparing the end point determination time and the present polishing time with each other and determining that the polishing end time comes if the end point determination time is equal to or smaller than the present polishing time and the number of times by which the average gradient in the short time counted becomes within the predetermined threshold value is equal to or greater than a predetermined number.

With any of the working process end point real time determination methods according to the present invention, a working process end point is estimated by extrapolation from a manner of the variation of the average gradient of the averaged data in a predetermined period of the working process measurement signal to perform determination of the end point, or where the working process does not allow such extrapolation, it is first determined that the working process at present is in the proximity of the working process end point based on the absolute value of the average gradient of the averaged data of the working process measurement signal, and then the working process end point is determined using a gradient in a short time calculated only from a value at the present measurement point of time and another value in the nearest past from within the averaged data of the working process measurement signal. Consequently, even when the working process measurement signal exhibits such a great variation that, even if it is averaged, a variation remains in the averaged working process measurement signal data, the effect that determination of the working process end point can be performed appropriately with a high degree of accuracy without suffering from wrong determination can be achieved.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENTS

First Embodiment

Figure 1:
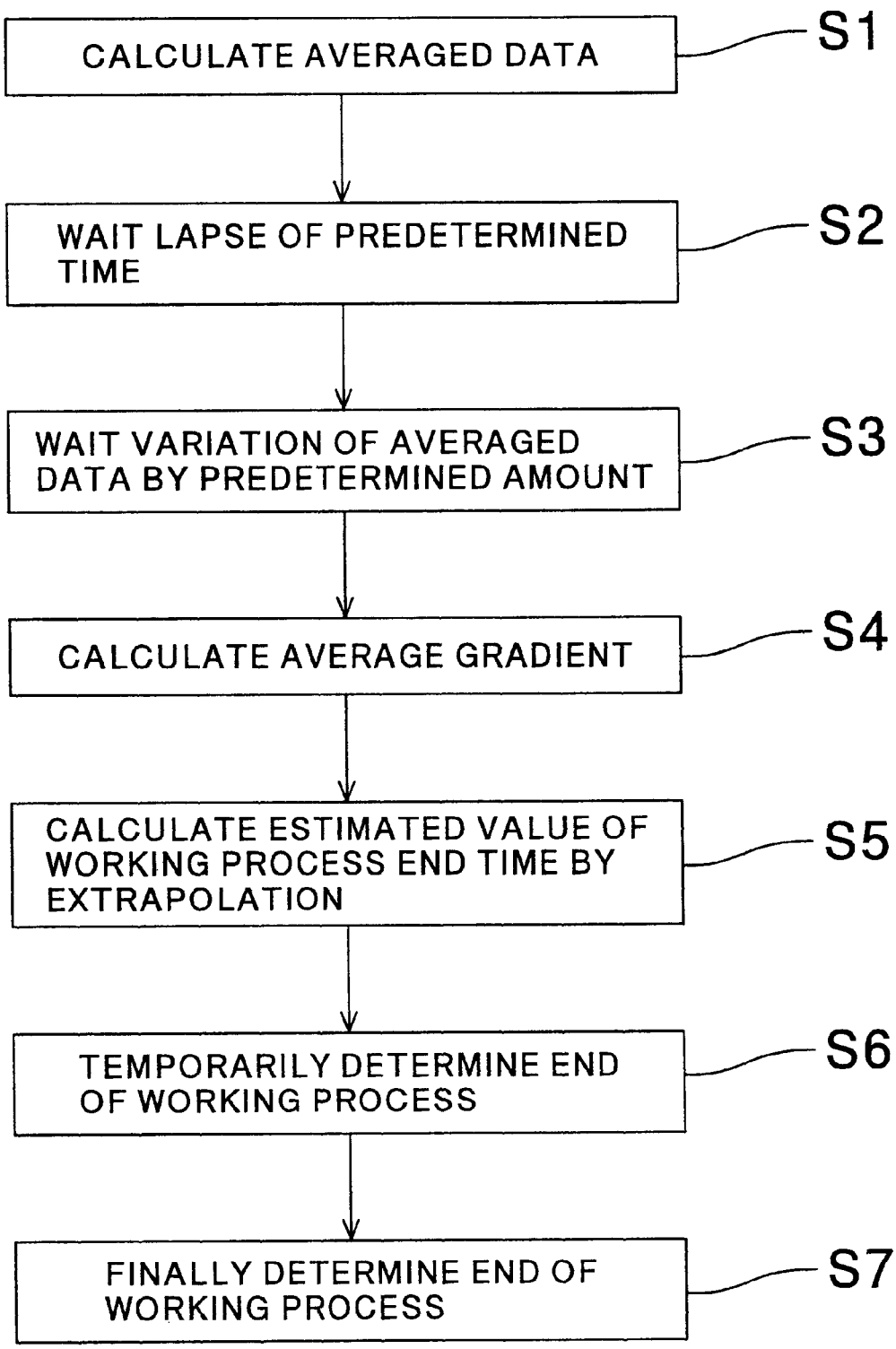
FIG. 1 is a flow chart illustrating a working process end point real time determination method to which the present invention is applied;.
Figure 3:
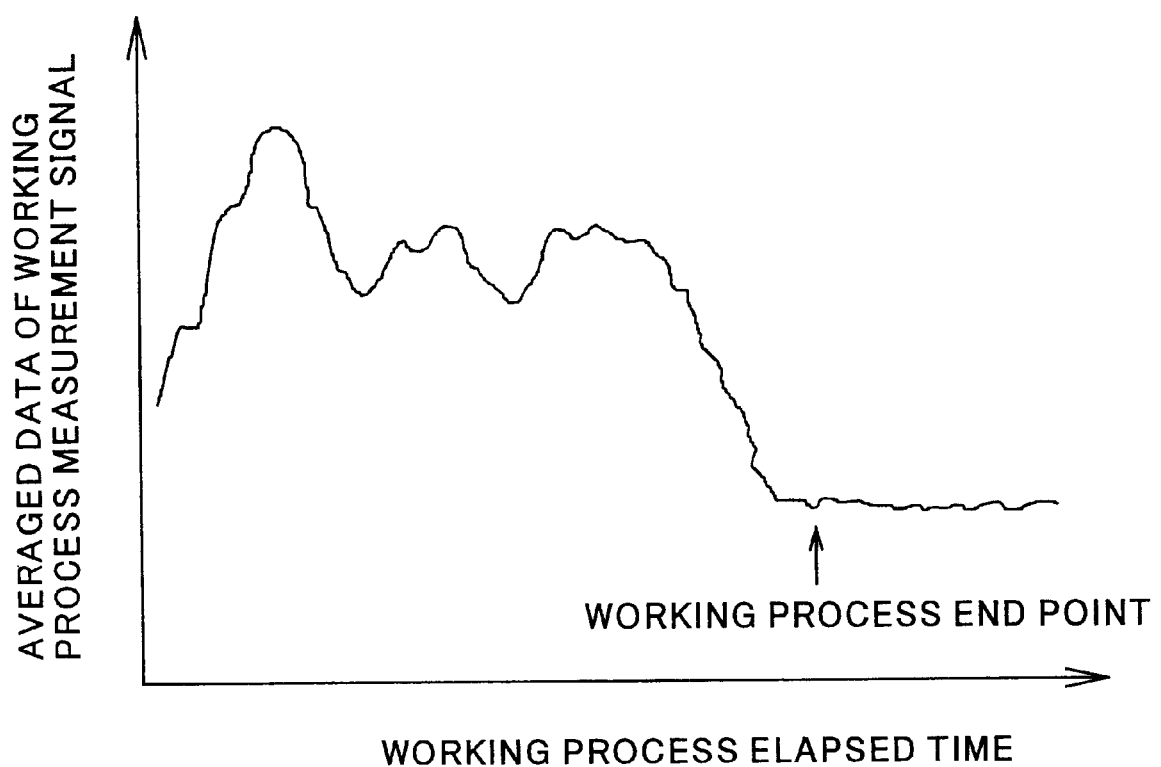
FIG. 3 is a graph illustrating an example of a variation with respect to time of averaged data calculated from the working process measurement signal illustrated in FIG. 2.
Figure 4:
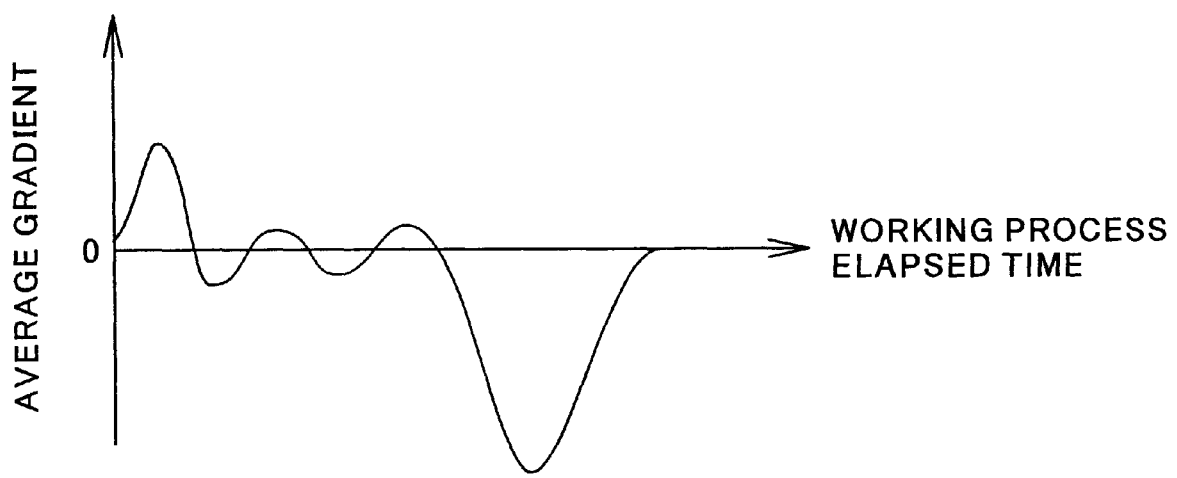
FIG. 4 is a graph illustrating an example of a variation with respect to time of an average gradient calculated from the variation of averaged data illustrated in FIG. 3.

Referring first to FIG. 1, there is illustrated a working process end point real time determination method according to the first preferred embodiment of the present invention. The working process end point real time determination method includes:

- a first step S1 of averaging a working process measurement signal obtained from a working process measuring instrument and indicating the progress of a working process at intervals equal to an integral number of times of a predetermined period to discretely calculate an average value for each interval equal to the integral number of times the predetermined period as averaged data;

- a second step S2 of successively comparing a working process elapsed time up to the present with a predetermined time set in advance and waiting for the working process elapsed time up to the present to exceed the predetermined time set in advance;

- a third step S3 of waiting for the averaged data of the working process measurement signal calculated in the first step S1 to reach a predetermined value or a predetermined multiple;

- a fourth step S4 of calculating an average value of a plurality of ones of the averaged data (FIG. 3) of the working process measurement signal calculated in the first step S1 which belong to a predetermined period in the past including the value of the averaged data at the present measurement point of time and an average value of another plurality of ones of the averaged data which belong to another predetermined period in the further past and calculating a variation amount per unit time between the two average values as the average gradient (FIG. 4);

- a fifth step S5 of joining, after an absolute value of the average gradient of the averaged data of the working process measurement signal calculated in the fourth step S4 assumes a value equal to or higher than a predetermined value (first threshold value) set in advance, the average gradient at the present measurement point of time and another one of the average gradients in the near past to perform extrapolation to the future to calculate a time at which the average gradient becomes equal to zero in the future as an estimated value of a working process end time;

- a sixth step S6 of subtracting a delay time caused by use of the data in the past from the estimated value up to the end of the working process calculated in the fifth step S5 and temporarily determining that the working process has come to an end if the time obtained by the subtraction indicates a time prior to the present measurement point of time; and

- a seventh step S7 of calculating a short time gradient of the averaged data (FIG. 3) of the working process measurement signal only from a value at the present measurement point of time and another value in the nearest past from within the averaged data of the working process measurement signal calculated in the first step S1 and determining that the working process has come to an end from a logical AND between when the short time gradient reaches a value within a predetermined range (second threshold value) set in advance successively more than a predetermined number of times, that the short time gradient exhibits a value within the predetermined range (second threshold value) totally by more than the predetermined number of times after the absolute value of the average gradient assumes a value higher than a predetermined value (first threshold value) or that the ratio at which the short time gradient assumes a value within the predetermined range (second threshold value) is equal to or higher than a predetermined ratio and that a time obtained by subtracting the delay time caused by use of the data in the past from the estimated value up to the end of the working process indicates a time prior to the present measurement point of time.

Operation of the First Embodiment

A working process measurement signal which is obtained from a working process measuring instrument provided for a semiconductor process apparatus and so forth and indicates the progress of a working process exhibits a great increase or decrease once as a working process proceeds while exhibiting fluctuations and then enters a steady state as the predetermined working process is completed Accordingly, in order to determine that a working process has come to an end, the point of time at which the entrance into the steady state is completed is determined from the working process measurement signal which exhibits fluctuations.

According to the working process end point real time determination method, a point at which a working process measurement signal including fluctuations which is obtained from various working processing measuring instruments provided for a semiconductor process apparatus or the like and indicates the progress of a working process exhibits a great variation once as the working process proceeds and then enters into a steady state fully is determined as an end point of the working process on the real time basis while the working process is proceeding.

Figure 2:
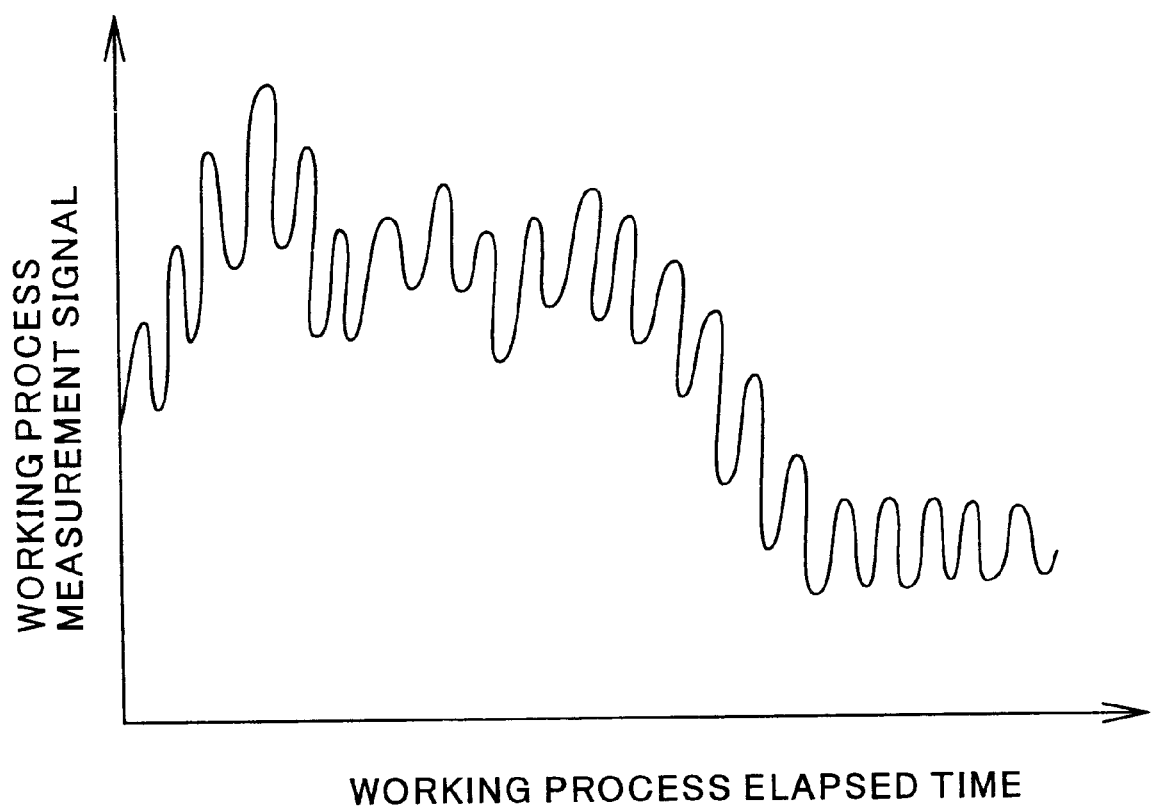
FIG. 2 is a graph illustrating an example of a variation with respect to time of a working process measurement signal obtained by a working process measuring instrument as a working process proceeds.

FIG. 2 illustrates an example of a variation with respect to time of the working process measurement signal obtained from the working process measuring instrument as the working process proceeds. The working process measurement signal obtained from the working process measuring instrument includes periodical variations because a measurement position is scanned in a fixed cycle or, although the measurement position is fixed, the working process side includes a periodical operation from such a reason that the procedure of the working process involves some irregularity depending upon the spatial position and so forth. Since the progress of the working process appears on a signal variation from which the periodical variations have been removed, in the first step S1, averaging is performed at intervals equal to an integral number of times a predetermined period set in advance in accordance with the period of the variation to discretely calculate an average value for each interval equal to the integral number of times the predetermined period as averaged data.

FIG. 3 illustrates an example of a variation with respect to time of the averaged data calculated in the first step S1. The working process measurement signal in an initial stage of the working process exhibits a different variation from the procedure of the working process even if the periodical variation is removed from the working process measurement signal in the first step S1 because the initial state prior to the working process is not fixed, and the different variation makes a factor of wrong determination. Therefore, the second and third steps S2 and S3 are used to prevent wrong determination of the working process end point caused by the signal which exhibits a different variation from the procedure of the working process in the initial stage of the working process.

In the second step S2, the predetermined time set in advance and the working process elapsed time up to the present are compared with each other, and it is waited that the working process elapsed time up to the present exceeds the predetermined time set in advance, that is, the operations in the first and second steps S1 and S2 are repeated and the working process does not advance to the next step.

In the third step S3, a maximum value or a minimum value of the averaged data of the working process measurement signal calculated in the first step S1 is detected, and a difference or a ratio between the maximum value or the minimum value detected up to the present point of time and the averaged data of the working process measurement signal at present is calculated. Then, the method waits for the difference or ratio to reach a predetermined value set in advance (predetermined threshold value) or a predetermined multiple. For example, if the detected maximum value is used as a reference for calculation of a ratio and the predetermined multiple is 0.7, then it is waited that the averaged data of the working process measurement signal at present decreases to 70% the maximum value.

Thus, it is important to use both of the second and third steps S2 and S3.

The variation of the working process measurement signal in the initial stage of the working process is great in the beginning of the initial stage of the working process and thereafter decreases gradually. Further, the rate of the working process fluctuates every time.

In this instance, if it is tried otherwise to prevent wrong determination only with the second step S2, then since the second step S2 is a step for preventing the determination operation from being performed only for the predetermined time, the time up to the end of the working process disperses, and therefore, wrong determination of the working process end point occurs. For example, if the time up to the end of the working process is shorter, then the working process comes to an end before the determination operation of the working process end point is started. On the contrary, if the time up to the end of the working process is longer, then the working process end point determination operation is started while a signal variation different from the procedure of the working process in the initial stage of the working process remains, resulting in wrong determination.

On the other hand, if it is tried otherwise to prevent wrong determination only with the third step S3, then since the third step S3 is a step for detecting that the signal has varied by a great amount and starting the working process end point determination operation, a great variation in the beginning of the initial stage of the working process is determined as a working process end point in error.

Accordingly, both of the second step S2 and the third step S3 are used so that prevention of wrong determination is performed in the second step S2 for a time which exceeds a time of a great signal variation in the beginning of the initial stage of the working process and then prevention of wrong determination for a succeeding time of a smaller signal variation is performed in the third step S3.

Then, entrance of the working process into the steady state is determined using the averaged data of the working process measurement signal calculated in the first step S1 to perform determination of the end of the working process.

One of popular methods of determining a point at which a varying signal enters a steady state is to calculate a gradient (differentiated value) of the signal at a present measurement point of time and determine a point of time at which the gradient comes to the proximity of 0. However, even if the working process measurement signal is averaged to remove a periodical variation in the first step S1, since the averaged data of the working process measurement signal obtained in the first step S1 includes remaining noise components originating from irregularity of the working process, the accuracy of a measuring apparatus or mixture of noise, wrong determination of the working process end point occurs with the method wherein entrance of the working process into a steady state is determined from the fact that the gradient of the averaged data of the working process measurement signal at the present measurement point of time comes to the proximity of 0. Therefore, data wherein noise components are smoothed sufficiently must be used for determination of the working process end point.

Therefore, in the fourth step S4, as the smoothing processing, an average gradient of a plurality of ones of the averaged data of the working process measurement signal calculated in the first step S1 which belong to a predetermined period in the past is calculated.

More particularly, in the fourth step S4, an average value of a plurality of ones of the averaged data of the working process measurement signal calculated in the first step S1 which belong to a predetermined period in the past including the value of the averaged data at the present measurement point of time and an average value of another plurality of ones of the averaged data which belong to another predetermined period in the further past, and a variation amount per unit time between the two average values is calculated as the average gradient.

Alternatively, in the fourth step S4, it is possible to determine an expression of an approximate straight line by a least square approximation method using a plurality of ones of the averaged data of the working process signal calculated in the first step S1 which belong to a predetermined period in the past including the value of the averaged data at the present measurement point of time and calculate a gradient of the thus determined straight line as the average gradient. In summary, it is required only to remove a short period variation by averaging the data sufficiently including the data in the past to extract a great signal variation to be detected, and there is no limitation to the technique for achieving this.

Consequently, the variation of the averaged data of the working process measurement signal obtained in the first step S1 is smoothed, and the average gradient calculated in the fourth step S4 is almost free from a variation.

FIG. 4 illustrates an example of a variation with respect to time of the average gradient calculated in the fourth step S4. The variation of the average gradient with respect to time assumes a minimum value (maximum in the absolute value) a little forwardly of the end of the working process and then approaches 0. This is because, because of an initial dispersion of an object work of the working process, a dispersion of the spatial position of the working process proceeding rate which arises from the working process apparatus or the like, the working process proceeding condition on the working process object work has some irregularity and some area whose working process is not completed remains partially even in the proximity of the working process end point. Consequently, the working process measurement signal gradually varies until the working process for the remaining partial area comes to an end completely.

However, if the point of time at which the average gradient obtained in the fourth step S4 comes to the proximity of 0 is determined as the working process end point, then since a time delay caused by use of the data in the past is involved, the working process end determination is delayed. Therefore, in the fifth step S5, after an absolute value of the average gradient of the averaged data of the working process measurement signal calculated in the fourth step S4 assumes a value equal to or higher than a predetermined value, the average gradient at the present measurement point of time and another one of the average gradients in the near past are used to perform extrapolation to the future to calculate a time at which the average gradient is estimated to become equal to 0 in the future as an estimated value of the working process end time.

The extrapolation is performed, for example, if the absolute value of the average gradient of the averaged data of the working process measurement signal calculated in the fourth step S4 varies linearly after it assumes a value equal to or higher than a predetermined value (first threshold value), by determining an expression of a straight line which passes two points of the average gradient at the present measurement point of time and another average gradient immediately preceding to the same and then calculating a time at which the average gradient is estimated to become equal to 0 from the expression of the straight line.

Alternatively, it is possible to determine an approximation expression such as a quadratic function by a least square method using three or more average gradients of the averaged data which belong to the past including the average gradient at the present measurement point of time and calculate a time at which the average gradient is estimated to become equal to 0 from the approximation expression.

In this instance, since the estimated value calculated in the fifth step S5 includes a time delay caused by use of the data in the past, it has a delay by a time corresponding to the number of data used for the calculation of the average gradient from an actual working process end time to be determined. Therefore, in the sixth step S6, the delay time corresponding to the number of data used for the calculation of the average gradient in the fourth step S4 is subtracted from the estimated value up to the end of the working process calculated in the fifth step S5, and it is temporarily determined that the working process has come to an end if the working process time obtained by the subtraction indicates a time prior to the present measurement point of time.

Further, the estimated value of the time up to the end of the working process calculated in the fifth step S5 includes some error caused by mixture of noise and so forth and the error makes a factor of wrong determination in the sixth step S6. Therefore in the seventh step S7, overlooking some error, a short time gradient of the averaged data of the working process measurement signal is calculated only from the value at the present measurement point of time and the value in the nearest past from within the averaged data of the working process measurement signal calculated in the first step S1, and it is determined that the working process has come to an end from a logical AND between when the short time gradient reaches a value within a predetermined range successively more than a predetermined number of times, that the short time gradient exhibits a value within the predetermined range (second threshold value) totally by more than the predetermined number of times after the absolute value of the average gradient assumes a value equal to or higher than the first threshold value or that the ratio at which the short time gradient assumes a value within the predetermined range (second threshold value) is equal to or higher than a predetermined ratio and that a time obtained by subtracting the delay time caused by use of the data in the past from the estimated value up to the end of the working process indicates a time prior to the present measurement point of time.

Since the short time gradient is calculated with a reduced time in the past and a delay time from an actual working process end point does not occur, if the short time delay comes to a value within the predetermined range, then it can be determined that the working process is in the proximity of the working process end point. Further, since the short time gradient has a great variation, wrong determination arising from a variation of the short time delay is prevented by determining that the working process comes to an end from a logical AND with the determination result in the sixth step S6 that the working process time is prior to the present measurement point of time.

It is to be noted that the method of determining in the seventh step S7 that the short time gradient is in the proximity of 0 and the working process time is in the proximity of the working process end point is not limited to the specific means described above. Anyway, it is required for the determination method to minimize the influence of the variation of the short time gradient.

Further, in the fifth step, it is otherwise possible to determine an expression of a straight line by a least square approximation method using three or more average gradients of the averaged data which belong to the past including the average gradient at the present measurement point of time and calculate a time at which the average gradient becomes equal to 0 from the expression of the straight line only when the gradient of the straight line determined is in the positive if the averaged data exhibits a variation with respect to time wherein the averaged data decreases by a great amount once and then enters a steady state or only when the gradient of the straight line determined is in the negative if the averaged data exhibits another variation with respect to time wherein the averaged data increases by a great amount once and then enters a steady state.

Second Embodiment

Figure 5:
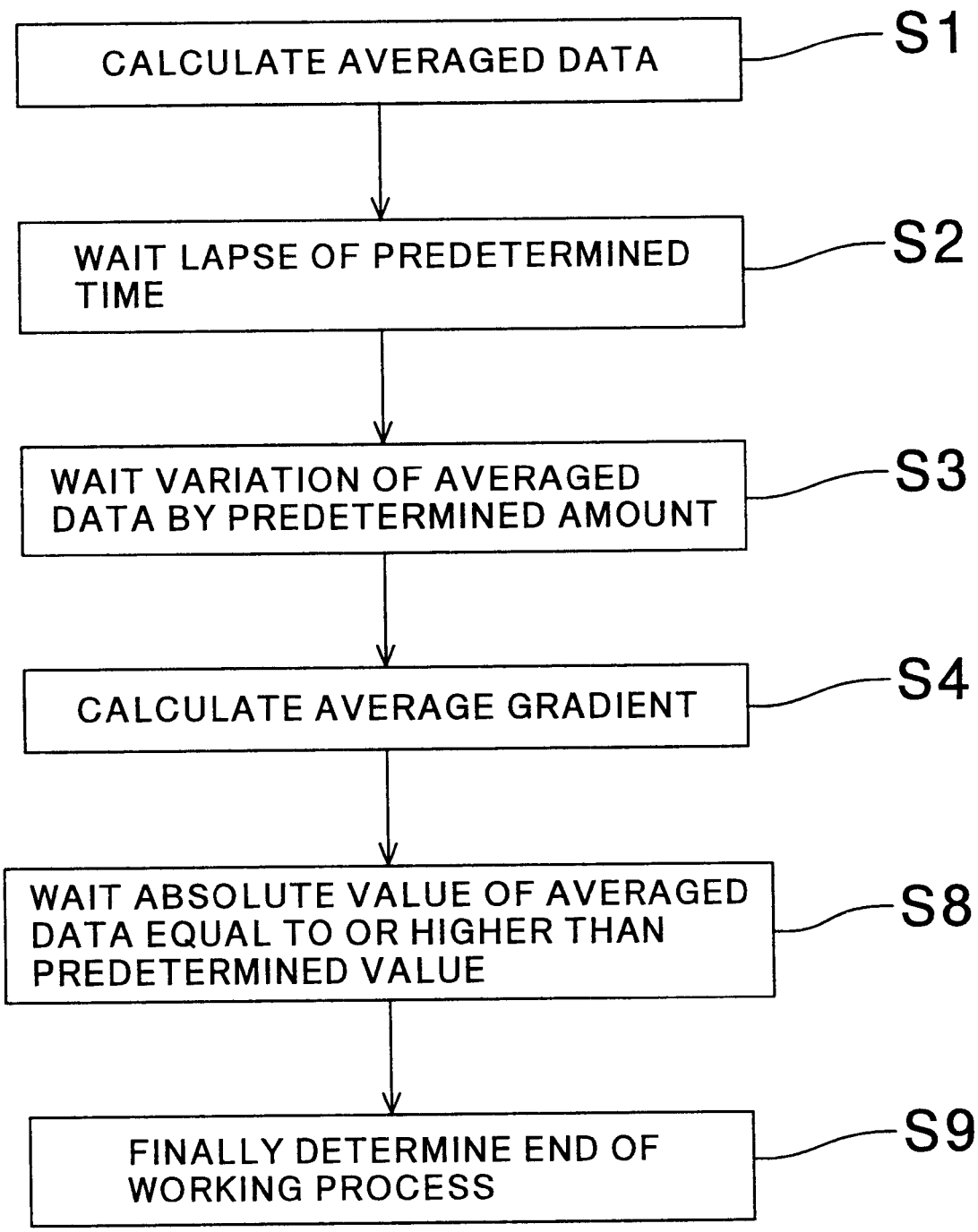
FIGS. 5 and 6 are flow charts illustrating different working process end point real time determination methods to which the present invention is applied.

Referring now to FIG. 5, there is illustrated a working process end point real time determination method according to the second preferred embodiment of the present invention. The working process end point real time determination method includes:

a first step S1 of averaging a working process measurement signal obtained from a working process measuring instrument and indicating the progress of a working process at intervals equal to an integral number of times a predetermined period to discretely calculate an average value for each interval equal to the integral number of times the predetermined period as averaged data;

a second step S2 of successively comparing a working process elapsed time up to the present with a predetermined time set in advance and waiting that the working process elapsed time up to the present exceeds the predetermined time set in advance;

a third step S3 of waiting that the averaged data of the working process measurement signal calculated in the first step S1 reaches a predetermined value or a predetermined multiple;

a fourth step S4 of calculating an average value of a plurality of ones of the averaged data of the working process measurement signal calculated in the first step S1 which belong to a predetermined period in the past including the value of the averaged data at the present measurement point of time and an average value of another plurality of ones of the averaged data which belong to another predetermined period in the further past and calculating a variation amount per unit time between the two average values as the average gradient;

an eighth step S8 of waiting that an absolute value of the average gradient of the averaged data of the working process measurement signal calculated in the fourth step S4 becomes equal to or higher than a predetermined value (first threshold value) set in advance; and a ninth step S9 of calculating a short time gradient of the averaged data of the working process measurement signal only from the value at the present measurement point of time and the value in the nearest past of the averaged data of the working process measurement signal calculated in the first step S1 after the absolute value of the average gradient of the averaged data of the working process measurement signal calculated in the fourth step S4 becomes equal to or higher than the first threshold value and determining that the working process has come to an end if the short time gradient reaches a value within a predetermined range (second threshold value) successively more than a predetermined number of times, if the short time gradient assumes a value within the predetermined range (second threshold value) totally by more than the predetermined number of times after the absolute value of the average gradient becomes equal to or higher than the first threshold value or if the ratio at which the short time gradient assumes a value within the predetermined range (second threshold value) is equal to or higher than a predetermined ratio.

The working process end point real time determination method of the present embodiment is suitably applied to a working process with which there is no sufficient time margin in which estimation by extrapolation of a working process end point described hereinabove in connection with the first embodiment is to be performed because average data of a working process measurement signal exhibits a sudden variation at the working process end point from a characteristic of a working process object article or a working process apparatus or extrapolation cannot be performed because the manner of the variation with respect to time of the averaged data of the working process measurement signal is different among different working processes. Also the working process end point real time determination method of the present embodiment includes similar steps of operations to those of the first embodiment up to the fourth step S4 in which an average gradient over a plurality of ones of the averaged data of the working process measurement signal calculated in the first step S1 which belong to a predetermined period in the past including the value of the averaged data at the present measurement point of time. Accordingly, in the following, operations only in the eighth step S8 et seq. are described.

In such a working process with which there is no sufficient time margin in which estimation by extrapolation of a working process end point is to be performed or extrapolation cannot be performed because the manner of the variation of the averaged data with respect to time is different as described above, the working process end point real time determination method cannot determine the working process end point with a high degree of accuracy. Therefore, in the working process end point real time determination method of the present embodiment, the working process end point is determined using a short time gradient of the averaged data of the working process measurement signal calculated only from the value at the present measurement point of time and the value in the nearest past of the averaged data of the working process measurement signal.

Since the short time gradient is calculated from the averaged data within a minimized time in the past, it has little time delay, but instead has a comparatively great variation. Therefore, if the working process end point is determined only from the short time gradient, then this gives rise to wrong determination. Therefore, in order to prevent such wrong determination, the determination of the working process end point in which the short time gradient is used is not performed until the working process comes near to the working process end point.

As described hereinabove in connection with the working process end point real time determination method of the first embodiment, the absolute value of the average gradient of the averaged data of the working process measurement signal calculated in the fourth step S4 assumes a maximum value in the proximity of the working process end point. Accordingly, it can be determined that the present working process is in the proximity of the working process end point if the absolute value of the average gradient of the averaged data of the working process measurement signal becomes equal to or higher than a predetermined value. Therefore, first in the eighth step S8, it is waited that an absolute value of the average gradient of the averaged data of the working process measurement signal calculated in the fourth step S4 becomes equal to or higher than a predetermined value (first threshold value) set in advance.

Then, in the ninth step S9, a short time gradient of the averaged data of the working process measurement signal is calculated only from the value at the present measurement point of time and the value in the nearest past of the averaged data of the working process measurement signal calculated in the first step S1, and it is determined that the working process has come to an end if the short time gradient reaches a value within a predetermined range (second threshold value) successively more than a predetermined number of times, if the short time gradient assumes a value within the predetermined range (second threshold value) totally by more than the predetermined number of times after the absolute value of the average gradient becomes equal to or higher than the predetermined value (first threshold value) or if the ratio at which the short time gradient assumes a value within the predetermined range (second threshold value) is equal to or higher than a predetermined ratio.

Since the difference between the time at which the short time gradient comes near to 0 and an actual working process end point is small, if the short time gradient comes to assume a value within the predetermined range, then it can be determined that the working process is in the proximity of the working process end point. Further, since the short time gradient has a comparatively great variation, wrong determination caused by the variation of the short time gradient is prevented by determining that the working process comes to an end only when the short time gradient assumes a value within a predetermined range successively or totally more than a predetermined number of times or the ratio at which the short time gradient assumes a value within the predetermined range is equal to or higher than a predetermined ratio.

Third Embodiment

The working process end point real time determination method of the present embodiment is applied to determination of a polishing end point on a polishing condition monitoring apparatus of the reflected light amount measurement type. The polishing condition monitoring apparatus monitors a polishing condition, as the polishing proceeds, from a variation of a reflected light amount which is obtained when inspection light is irradiated upon a polished face of a semiconductor wafer by a CMP apparatus which performs chemical and mechanical polishing (CMP) of the semiconductor wafer. Such a polishing condition monitoring apparatus as just described is disclosed, for example, in Japanese Patent No. 2,561,812.

Figure 6:
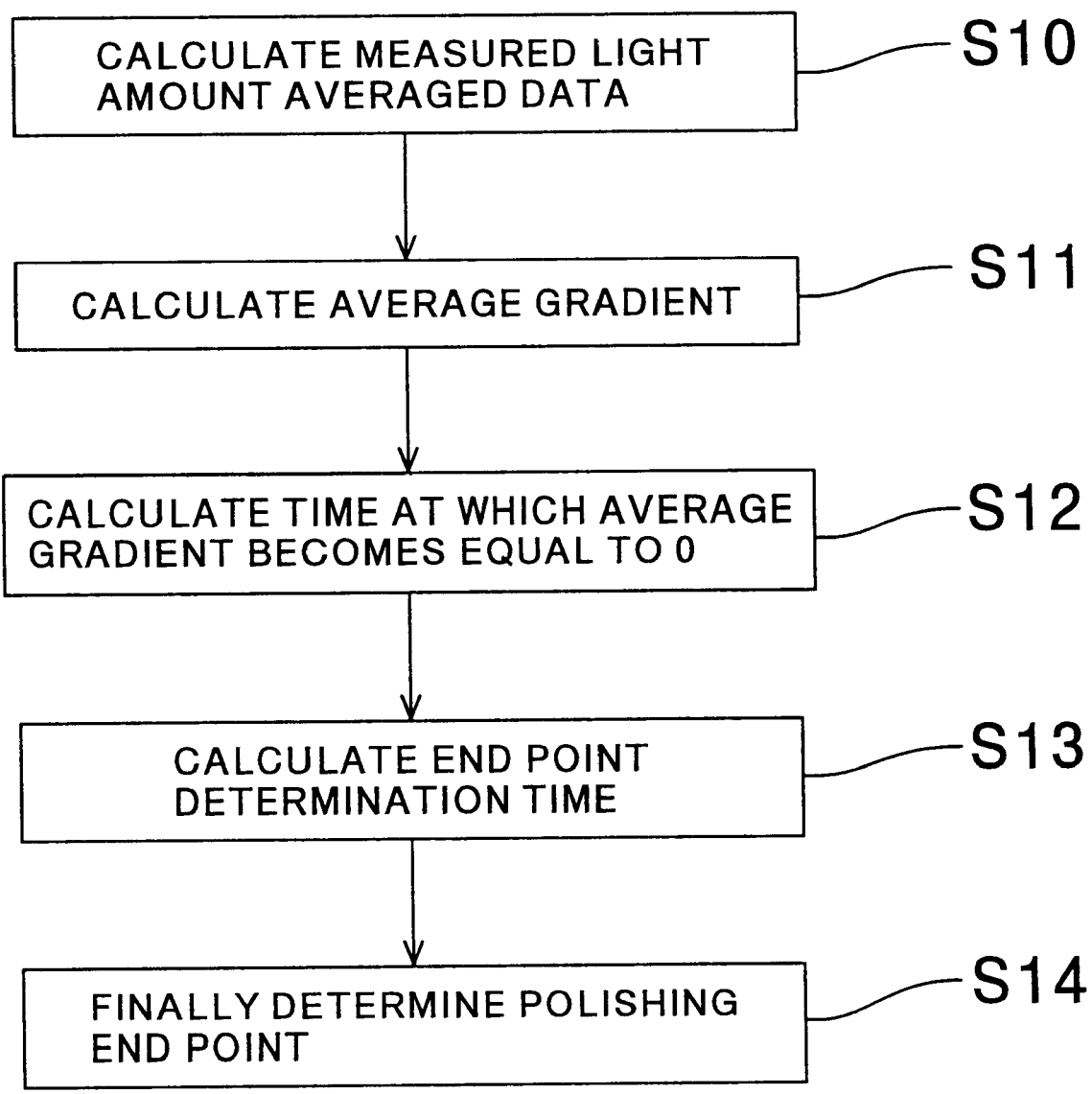

FIG. 6 illustrates the working process end point real time determination method of the present embodiment. Referring to FIG. 6, the working process end point real time determination method of the present embodiment includes:

a tenth step S10 of calculating, as measured light amount averaged data, an average value after each predetermined interval of time of a reflected light amount measured by a polished condition monitoring apparatus of the reflected light amount measurement type;

an eleventh step S11 of calculating an average value of a plurality of ones of the measured light amount averaged data calculated in the tenth step S10 which belong to a predetermined period in the past including the value of the measured light amount averaged data at the present measurement point of time and an average value of another plurality of ones of the measured light amount averaged data which belong to another predetermined period in the further past and calculating a variation amount per unit time between the two average values as average gradient data;

a twelfth step S12 of determining an expression of a straight line which passes two points of the average gradient at the present measurement point of time of the average gradient data calculated in the eleventh step S11 and another average gradient immediately preceding to the same and then calculating a time at which the average gradient becomes equal to 0 from the expression of the straight line if the gradient of the straight line is in the positive;

a thirteenth step S13 of subtracting a polishing time till the present since the oldest point of time in the past of the measured light amount averaged data used for calculation of the average gradient in the eleventh step S11 from the time calculated in the twelfth step S12 at which the relationship that the average gradient is equal to 0 is reached to calculate an end point determination time; and a fourteenth step S14 of comparing the end point determination time calculated in the thirteenth step S13 and the present polishing time with each other and determining the point of time at which the end point determination times becomes equal to or less than the present polishing time as a polishing end point.

Figure 7:
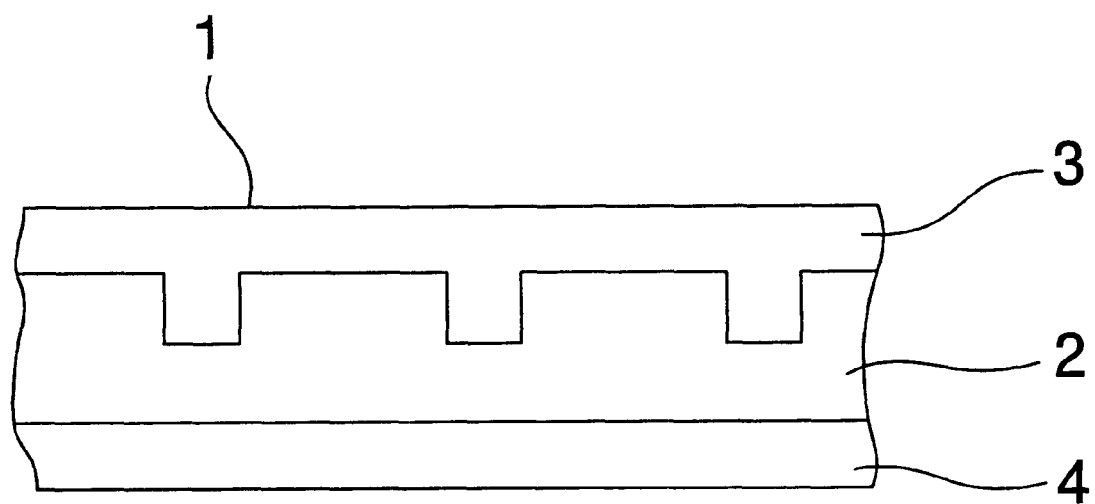
FIG. 7 is a schematic cross sectional view showing an example of a wafer which makes an object of polishing.

The polished condition monitoring apparatus of the reflected light amount measurement type to which the present invention is applied irradiates inspection light upon a polished face of a wafer 1 shown in FIG. 7 which is being polished and monitors the polished condition from a variation of the reflected light amount as the polishing proceeds.

As described also in the description of the working process end point real time determination method of the first embodiment, the working process measurement signal has a periodical variation. Also the reflected light amount signal successively varies as the polishing proceeds because the wafer 1 being polished is being rotated and the pattern density and the pattern direction within a range of the diameter of the beam of the inspection light irradiated upon the wafer 1 successively vary, and accordingly, if the reflected light amount signal is used as it is, then the variation of the polishing condition is buried in the variation originating from the pattern density and the pattern direction.

Therefore, in the tenth step S10, the measured reflected light amount is averaged within each predetermined interval of time to calculate measured light amount averaged data.

In this instance, since the inspection light passes the same point after each one rotation of the wafer 1 and the variation of the wiring line density on the wafer 1 exhibits one period by one rotation of the wafer 1, the time interval for the averaging may be set to the time interval within which the wafer 1 makes one rotation or the wafer 1 makes an integral number of rotations. Alternatively, the averaging only over a predetermined interval of time (for example, a time corresponding to a half rotation or the like) within the time within which the wafer 1 makes one rotation may be performed after each period of rotation of the wafer 1. Further, since a large number of chips having the same configuration are formed on the wafer 1, the reflected light amount may be averaged at time intervals within which the inspection light scans the chip.

The graph of the measured light amount averaged data calculated in the tenth step S10 exhibits a time variation similar to that described hereinabove with reference to FIG. 3 in connection with the working process end point real time determination method of the first embodiment. In particular, in an initial stage of the polishing, since the metal layer 3 having a high reflection factor with respect to the inspection light is applied to the overall area of the top face of the wafer 1, the measured light amount averaged data exhibits a high value. Then, as the polishing proceeds, the metal layer 3 is removed, and the insulator layer 2 having a low reflection factor with respect to the inspection light is exposed and begins to be polished. Or, where the insulator layer 2 is transparent to the inspection light, the inspection light begins to pass through the insulator layer 2 thus exposed and is reflected by the substrate 4 having a low reflection factor. Consequently, the reflected light amount gradually decreases. As the polishing further proceeds, metal wiring lines are finally formed completely. Consequently, even if the polishing thereafter proceeds, the area ratio between the insulator layer 2 and the metal layer 3 does not exhibit a variation any more, and accordingly, the measured light amount averaged data does not vary any more and enters a steady state.

Accordingly, since the point of time at which the metal wiring lines are formed completely is the polishing end point, the point at which the measured light amount averaged data enters a steady state indicates the polishing end point.

As described also in the description of the working process end point real time determination method of the first embodiment, one of popular methods of determining a point at which a varying signal enters a steady state is to calculate a gradient (differentiated value) of the signal at a present measurement point of time and determine a point of time at which the gradient comes to the proximity of 0. However, even if the measured light amount averaged data obtained in the tenth step S10 is obtained by averaging for each one rotation of the wafer 1, since the measured light amount averaged data includes a variation of the reflected light amount arising from a variation of the sampling position for each one rotation of the wafer 1 or a variation of the measurement value by noise of the measuring system or by an accuracy of the measurement wrong determination of the polishing end point occurs with the method wherein the polishing end point is determined based on the gradient at the present measurement point of time.

Therefore, in the eleventh step S11, an average value of a plurality of ones of the measured light amount averaged data calculated in the tenth step S10 which belong to a predetermined period in the past including the value of the measured light amount averaged data at the present measurement point of time and an average value of another plurality of ones of the measured light amount averaged data which belong to another predetermined period in the further past are calculated, and a variation amount per unit time between the two average values is calculated as average gradient data.

More particularly, since the gradients at a plurality of points in the past from the present measurement point of time are averaged in the eleventh step S11, the variation of the measured light amount averaged data obtained in the tenth step S10 is smoothed, and consequently, the average gradient data calculated in the eleventh step S11 is almost free from variations which arise from a dispersion, noise and so forth except a great variation which arises from the procedure of the polishing.

However, if determination of the polishing end point is performed using the average gradient calculated in the eleventh step S11, then since the average gradient includes an influence of the data in the past, the determination suffers from a delay if a common method which involves determination of a point of time at which the average gradient comes to the proximity of 0 is used.

As described also in the description of the working process end point real time determination method of the first embodiment, the measured light amount averaged data exhibits such a variation with respect to time that, after it begins a decrease, the gradient thereof becomes maximum at a certain point of time, and then the gradient gradually becomes gentle until it comes near to 0 at the polishing end point. This is because, since some polishing irregularity appears in a circumferential direction of the wafer from a dispersion of the initial thickness of the wafer, a variation of the pressurization force distribution of the polishing head, irregularity of the slurry amount and so forth and a non-polished area partially remains even in the proximity of the polishing end point, the reflected light amount drops moderately until the remaining partial area is polished completely.

Accordingly, as described hereinabove with reference to FIG. 4, the average gradient calculated in the eleventh step S11 exhibits such a time variation that it exhibits a minimum value at a predetermined point of time after the reflected light amount begins to decrease, and then approaches 0.

Therefore, in the twelfth step S12, a point at which the average gradient becomes equal to 0 is estimated and calculated by extrapolation from a manner of the variation of the average gradient calculated in the eleventh step S11. For the extrapolation, a method is used wherein, if the average gradient calculated in the eleventh step S11 varies linearly after it assumes a minimum value, an expression of a straight line which passes two points of the average gradient at the present measurement point of time and another average gradient immediately preceding to the same is determined and then a time at which the average gradient becomes equal to 0 is calculated from the expression of the straight line only when the gradient of the straight line is in the positive. On the other hand, where the variation of the average gradient value has a tendency of varying like a quadratic function, the curvature of the curve may be determined in advance with existing data and used for extrapolation with a quadratic curve.

It is to be noted that the time calculated at a point of time before the minimum point indicates an estimated value of the time at which the measured light amount averaged data begins to decrease. Accordingly, when the gradient of the straight line calculated is in the negative, calculation of the time at which the average gradient becomes equal to 0 is not performed. In this instance, since the average gradient is calculated using data which belong to a predetermined period in the past including the data at present and data which belong to another predetermined period in the further past, the time calculated in the twelfth step S12 at which the average gradient becomes equal to 0 has a delay corresponding to the number of data used for the calculation of the average gradient from the polishing end point time to be determined.

On the other hand, where the average gradient value has a tendency of varying in a quadratic function, it is possible to decide a curvature of the quadratic function with existing data and perform extrapolation on a quadratic curve based on the curvature. It is to be noted, however, that the time calculated at a point of time before the minimum point indicates an estimated value of the time at which the measured light amount averaged data begins to decrease.

Accordingly, when the gradient of the calculated straight line is in the negative, calculation of the time at which the average gradient becomes equal to 0 is not performed. In this instance, since the average gradient is calculated using data which belong to a predetermined period in the past including the data at present and data which belong to another predetermined period in the further past, the time calculated in the twelfth step S12 at which the average gradient becomes equal to 0 has a delay corresponding to the number of data used for the calculation of the average gradient from the polishing end point time to be determined.

Therefore, in the thirteenth step S13, a polishing time corresponding to the number of data used for the calculation of the average gradient in the eleventh step S11 is subtracted from the time calculated in the twelfth step S12 to calculate an end point determination time. In particular, a polishing time till the present since the oldest point of time in the past of the measured light amount averaged data used for calculation of the average gradient in the eleventh step S11 is subtracted from the time calculated in the twelfth step S12 at which the relationship that the average gradient is equal to 0 is reached to calculate an end point determination time.

Finally, in the fourteenth step S14, the end point determination time calculated in the thirteenth step S13 and the present polishing time are compared with each other, and the point of time at which the end point determination time becomes equal to or less than the present polishing time is determined as a polishing end point.

It is to be noted that, in the twelfth step, it is otherwise possible to determine an expression of a straight line by a least square approximation method using three or more average gradients of the averaged gradient data which belong to the past including the average gradient at the present measurement point of time and calculate a time at which the average gradient becomes equal to 0 from the expression of the straight line only when the gradient of the straight line determined is in the positive if the measured light amount averaged data exhibits a variation with respect to time wherein the measured light amount averaged data decreases by a great amount once and then enters a steady state or only when the gradient of the straight line determined is in the negative if the measured light amount averaged data exhibits another variation with respect to time wherein the measured light amount averaged data increases by a great amount once and then enters a steady state.

Fourth Embodiment

Figure 8:
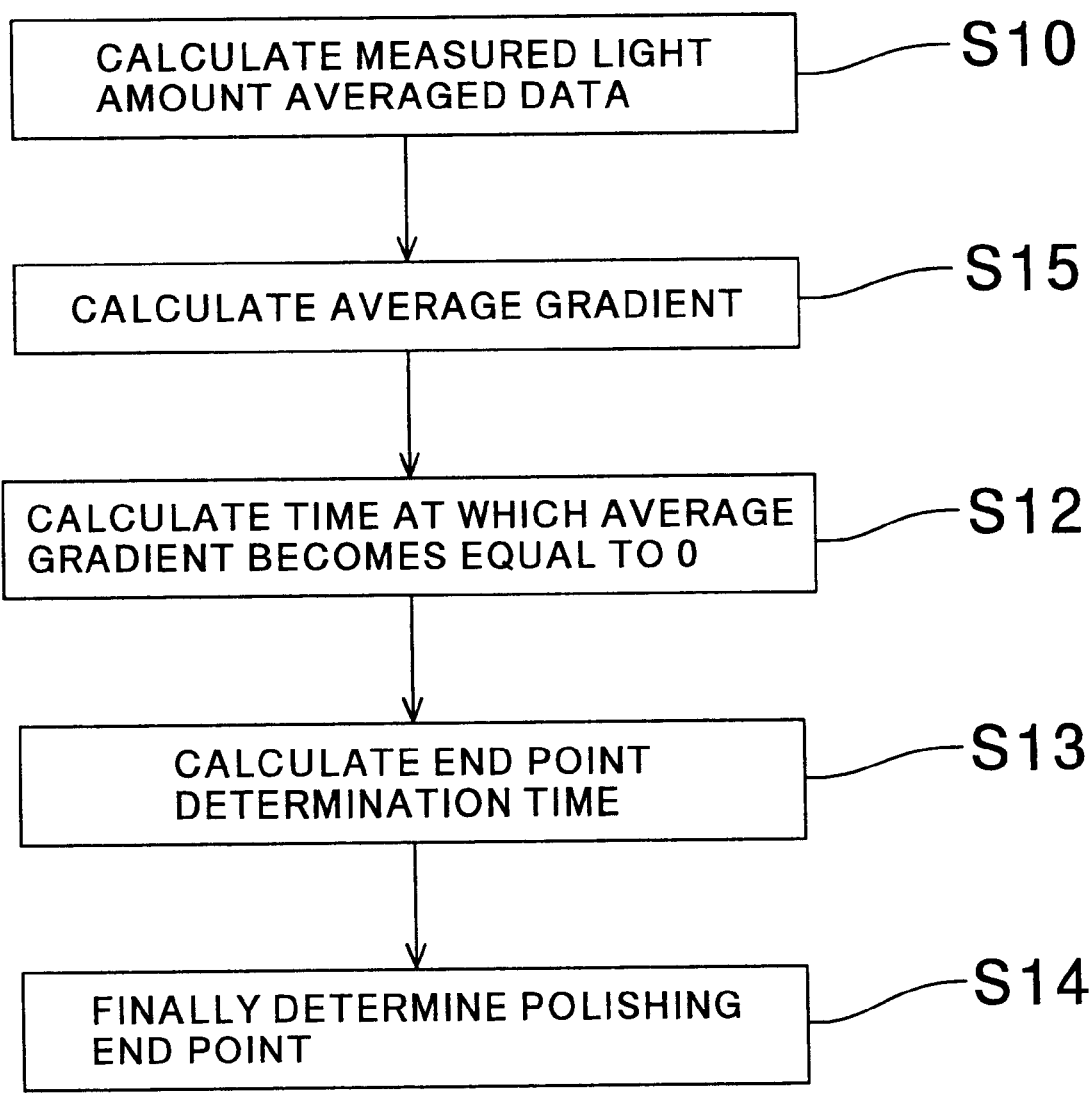
FIGS. 8 to 18 are flow charts illustrating further different working process end point real time determination methods to which the present invention is applied.

FIG. 8 illustrates a working process end point real time determination method according to the fourth preferred embodiment of the present invention. The working process end point real time determination method of the present embodiment is a modification to and is different from the working process end point real time determination method of the third embodiment described hereinabove with reference to FIG. 6 only in that it includes a fifteenth step S15 in place of the eleventh step S11. In the fifteenth step S15, a least square approximate straight line of a plurality of measured light amount averaged data which belong to a predetermined period in the past including a value of the measured light amount averaged data at the present measurement point of time from among the measured light amount averaged data calculated in the tenth step S10 is determined, and a gradient of the determined straight line is calculated as the average gradient. It is to be noted that overlapping description of the operations in the other common steps is omitted herein to avoid redundancy.

More particularly, in the fifteenth step S15, an expression of an approximate straight line is determined by a least square approximation method using a plurality of measured light amount averaged data which belong to a predetermined period in the past including a value of the measured light amount averaged data at the present measurement point of time from among the measured light amount averaged data calculated in the tenth step S10. Since the gradient of the approximate straight line indicates an average rate of change among the plurality of points used for the calculation, the gradient of the straight line determined is calculated as the average gradient.

Fifth Embodiment

Figure 9:
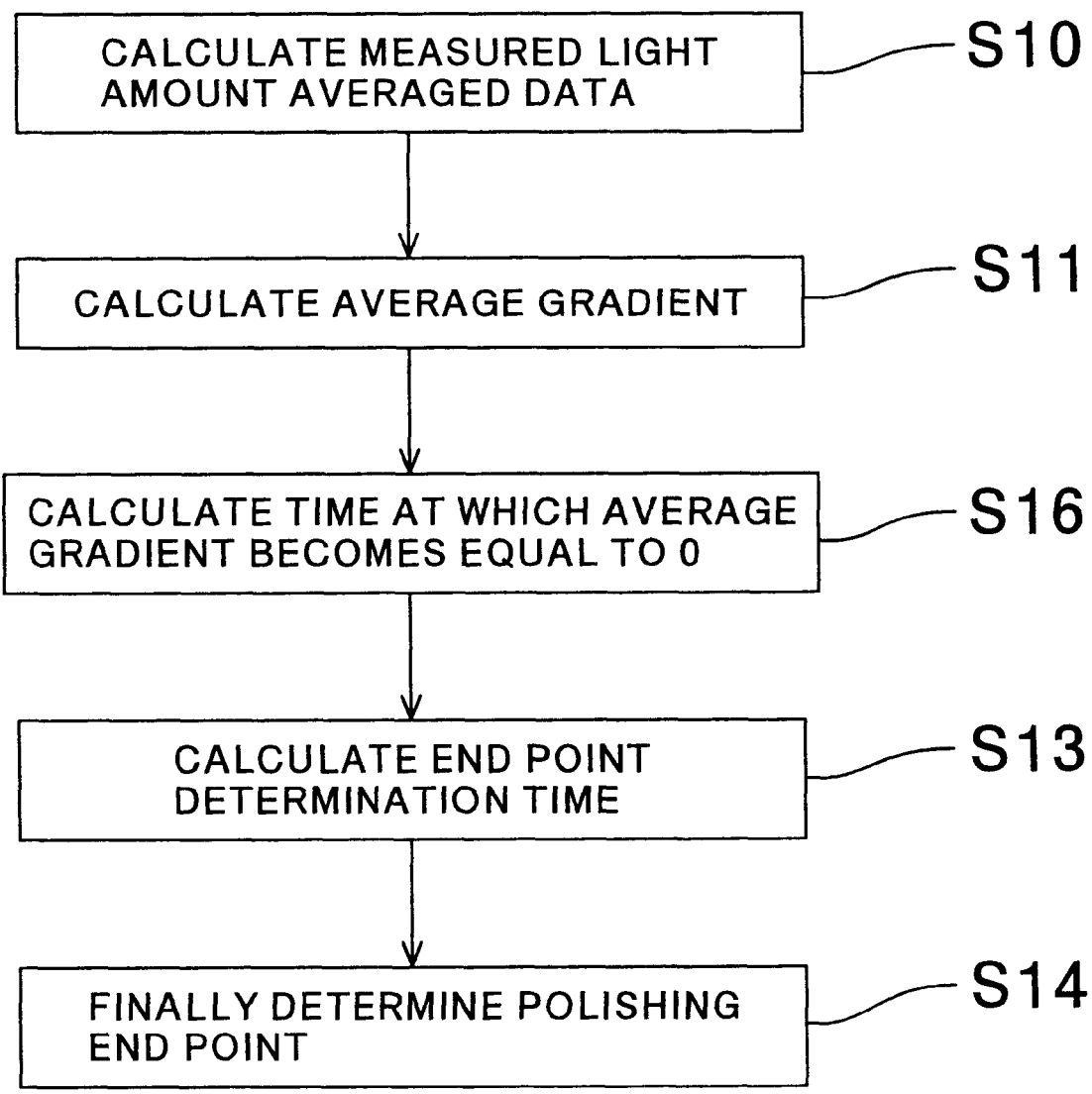

FIG. 9 illustrates a working process end point real time determination method according to the fifth preferred embodiment of the present invention. The working process end point real time determination method of the present embodiment is another modification to and is different from the working process end point real time determination method of the third embodiment described hereinabove with reference to FIG. 6 only in that it includes a sixteenth step S16 in place of the twelfth step S12. It is to be noted that overlapping description of the operations in the other common steps is omitted herein to avoid redundancy.

The working process end point real time determination method of the present embodiment is suitably applied where the reflection factors of the films formed on the wafer 1 which is used as an object of polishing are reverse to those in the working process end point real time determination method of the second embodiment described hereinabove, that is, where the reflection factor of the metal layer 3 which is applied to the entire face of the wafer 1 and is polished first is lower than the reflection factor of the insulator layer 2 or the substrate 4 which is exposed as the polishing proceeds. In order to allow polishing of the wafer 1 of the construction described, in the working process end point real time determination method of the present embodiment, when the point at which the average gradient becomes equal to 0 is estimated and calculated by extrapolation from a manner of the variation of the average gradient, the sixteenth step S16 is performed in place of the twelfth step S12.

When the wafer 1 to be polished has a structure wherein the reflection factor of the metal layer 3 applied to the overall face of the wafer 1 is lower than the reflection factor of the insulator layer 2 or the substrate 4 which is exposed as the polishing proceeds, the measured light amount averaged data calculated in the tenth step S1 exhibits a variation with respect to time which is reverse to that described hereinabove in connection with the working process end point real time determination method of the third embodiment with reference to FIG. 6. In particular, in an initial stage of the polishing, since the metal layer 3 having a low reflection factor with respect to the inspection light is applied to the overall area of the top face of the wafer 1, the measured light amount averaged data exhibits a low value. Then, as the polishing proceeds, the insulator layer 2 having a high reflection factor with respect to the inspection light is exposed and begins to be polished. Or, where the insulator layer 2 is transparent to the inspection light, the inspection light begins to pass through the insulator layer 2 thus exposed and is reflected by the substrate 4 having a high reflection factor. After the working process passes the polishing end point, the measured light amount averaged data does not vary any more.

Consequently, the average gradient data calculated in the eleventh step S11 exhibits a variation wherein it assumes a maximum value at a predetermined point of time after the measured light amount averaged data begins to increase and thereafter approaches 0, and the sign of the average gradient is reverse to that in the working process end point real time determination method of the third embodiment.

Therefore, in the sixteenth step S16 for estimation and calculation of the point at which the average gradient becomes equal to 0 by extrapolation from a manner of the variation of the average gradient, an expression of a straight line which passes two points of the average gradient of the average gradient at the present measurement point of time of the average gradient data calculated in the eleventh step S11 and another average gradient immediately preceding to the same is determined, and a time at which the average gradient becomes equal to 0 is calculated from the expression of the straight line only when the gradient of the straight line is in the positive, but when the gradient of the straight line is in the negative, the calculation of the time at which the average gradient becomes equal to 0 is not performed.

Such a situation as described above occurs even depending upon selection of the wavelength of the inspection light.

The different layers on the wafer 1 have different spectral reflection factors from one another and the reflection factors of the layers with respect to a single predetermined wavelength are different from one another. Accordingly, if monochromatic light is used for the inspection light, then depending upon the selected wavelength, the reflection factor of the metal layer 3 which is applied to the overall face of the wafer 1 and is polished first may be higher than the reflection factor of the insulator layer 2 or the substrate 4 which is exposed as the polishing proceeds as in the working process end point real time determination method of the third embodiment, or the reflection factor of the metal layer 3 which is applied to the overall face of the wafer 1 and is polished first may be lower than the reflection factor of the insulator layer 2 or the substrate 4 which is exposed as the polishing proceeds as in the working process end point real time determination method of the present embodiment.

Sixth Embodiment

Figure 10:
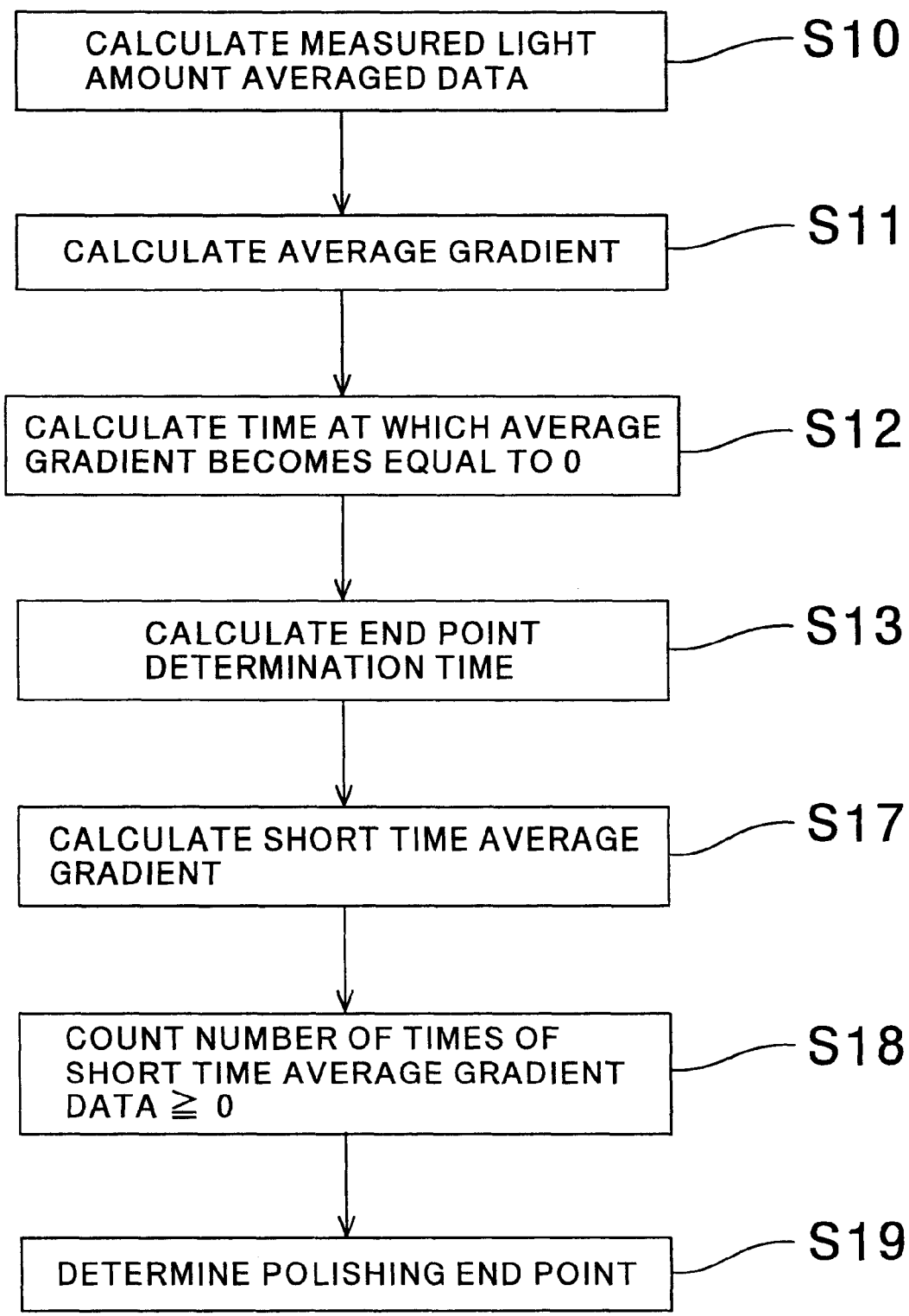

FIG. 10 illustrates a working process end point real time determination method according to the sixth preferred embodiment of the present invention. The working process end point real time determination method of the present embodiment is suitably applied particularly where, because the polishing rate is low in the proximity of the polishing end point and the average gradient approaches 0 moderately in the proximity of the polishing end point, if the time at which the average gradient becomes equal to 0 is estimated and calculated with an expression of a straight line, the polishing end point determined is earlier than an actual polishing end point. The working process end point real time determination method of the present embodiment is a further modification to and is different from the working process end point real time determination method of the third embodiment described hereinabove with reference to FIG. 6 only in that it includes seventeenth to nineteenth steps S17 to S19 in place of the fourteenth step S14. It is to be noted that overlapping description of the operations in the other common steps is omitted herein to avoid redundancy.

Depending upon the structure of the wafer or the polishing characteristic of the CMP apparatus, when the point at which the average gradient becomes equal to 0 is to be estimated and calculated by extrapolation from a manner of the variation of the average gradient calculated in the eleventh step S11, it may not be estimated or calculated correctly with an expression of a straight line. Particularly where the polishing rate is low in the proximity of the polishing end point and the average gradient approaches 0 moderately in the proximity of the polishing end point, if the time is estimated with an expression of a straight line, then the polishing end point determined is earlier than an actual polishing end point. The working process end point real time determination method of the present embodiment prevents the wrong determination just described.

First in the seventeenth step S17, an average gradient is calculated in a similar manner as in the eleventh step S11. In this instance, however, the gradient in a short time of the measured light amount averaged data is calculated only from the value at the present measurement point of time and the value in the nearest past of the averaged data of the working process measurement signal. The average gradient in the short time exhibits a great variation because the number of points in the past used for the calculation is reduced, and if the polishing end point is determined only from the average gradient in the short time, then wrong determination occurs. However, the difference between the time at which the average gradient in the short time becomes equal to 0 and the actual polishing end time is small.

Therefore, in the eleventh step S18, an accumulated value of the number of times by which the average gradient data in the short time calculated in the seventeenth step S17 assumes a value equal to or higher than 0 is counted. Since the difference between the time at which the average gradient in the short time becomes equal to 0 and the actual polishing end time is small and the counting of the accumulated value is started in the proximity of the actual polishing end time, if the count value is equal to or higher than a predetermined value, then it can be determined that the polishing process is in the proximity of the polishing end point.

Finally in the nineteenth step S19, the end point determination time calculated in the thirteenth step S13 and the present polishing time are compared with each other, and it is determined that the polishing end time comes if the end point determination time is equal to or smaller than the present polishing time and the number of times by which the average gradient in the short time counted in the eighteenth step S18 is equal to or greater than 0 is equal to or greater than a predetermined number. Consequently, in this nineteenth step S19, the polishing end point is determined from a logical AND between the criterion of the polishing end point described hereinabove in connection with the working process end point real time determination method of the third embodiment and the condition that the count value of the number of times by which the average gradient in the short time is equal to or greater than 0 is equal to or greater than a predetermined number.

Accordingly, where the polishing rate is low in the proximity of the polishing end point and the average gradient approaches 0 moderately in the proximity of the polishing end point, if the time is estimated with the criterion used in the working process end point real time determination method of the third embodiment, then the polishing end point determined is earlier than an actual polishing end point. At this point of time, however, since the count value of the number of times by which the average gradient in the short time is equal to or greater than 0 is not greater than the predetermined number, such wrong determination can be prevented.

Seventh Embodiment

Figure 11:
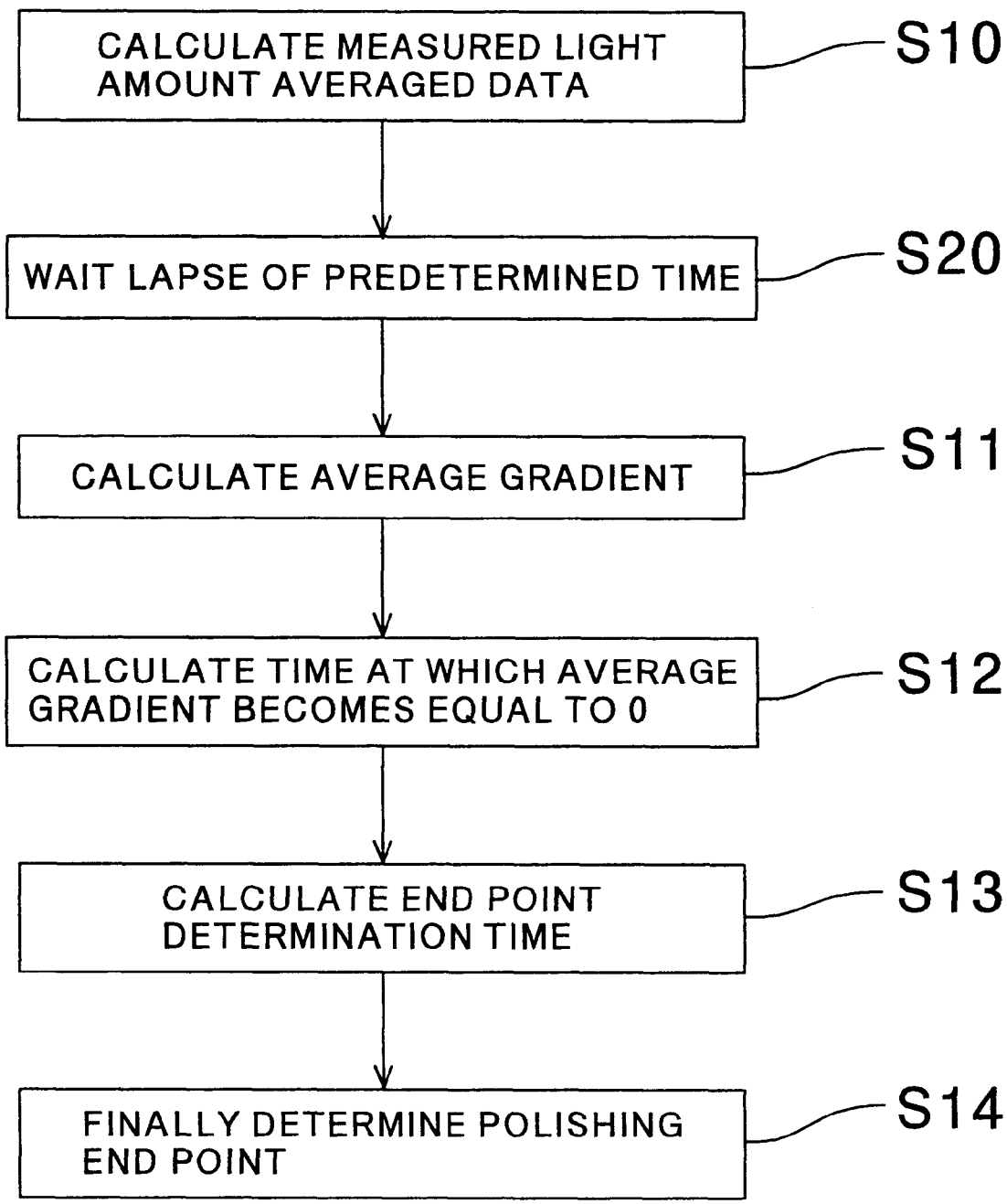

FIG. 11 illustrates a working process end point real time determination method according to the seventh preferred embodiment of the present invention. The working process end point real time determination method of the present embodiment is a still further modification to and is different from the working process end point real time determination method of the third embodiment described hereinabove with reference to FIG. 6 only in that it additionally includes a twentieth step S20 interposed between the tenth step S10 and the eleventh step S11. In the twentieth step S20, a predetermined time set in advance and a polishing elapsed time till the present are compared with each other and it is waited that the present polishing elapsed time becomes equal to or greater than the predetermined time set in advance.

The working process end point real time determination method of the present embodiment is suitably applied particularly where measured light amount averaged data calculated in the tenth step S10 in an initial stage of polishing exhibits a great variation and the polishing end point is likely to be determined in error. It is to be noted that overlapping description of the operations in the other common steps is omitted herein to avoid redundancy.

When the wafer 1 before polishing has some stain or the like on the surface thereof, when the CMP apparatus vibrates, when the slurry at the inspection light irradiation position has a deviation in thickness, or when the polishing amount per unit time varies depending upon a characteristic of the CMP apparatus or a pattern arrangement, the measured light amount averaged data calculated in the tenth step S10 exhibits a great variation particularly in an initial stage of polishing.

When the measured light amount averaged data calculated in the tenth step S10 has a variation in an initial stage of polishing, the variation that, after the measured light amount averaged data begins a decrease, the rate of variation exhibits its maximum at a certain point of time and then becomes moderate until it comes to the proximity of 0 at the polishing end point, which is a characteristic in the proximity of the polishing end point, appears a plurality of times before the polishing comes to an end. Accordingly, if the working process end point real time determination method of the third embodiment described hereinabove with reference to FIG. 6 is applied as it is, then wrong determination of the polishing end point occurs.

Therefore, in the twentieth step S20, a predetermined time set in advance and a polishing elapsed time till the present are compared with each other and it is waited that the present polishing elapsed time becomes equal to or greater than the predetermined time set in advance. Since the twenties step S20 is provided in order to prevent wrong determination of the polishing end point arising from a great variation of the measured light amount averaged data which appears in an initial stage of polishing, the predetermined time set in advance should be set so as to exceed a time over which a great variation of the measured light amount averaged data in an initial stage of polishing occurs.

In the working process end point real time determination method of the present embodiment, the twentieth step S20 is provided so that, within a time within which the measured light amount averaged data in an initial stage of polishing exhibits a significant variation, the polishing end point determination operation in the eleventh step S11 et seq. is not performed to prevent wrong determination.

Eighth Embodiment

Figure 12:
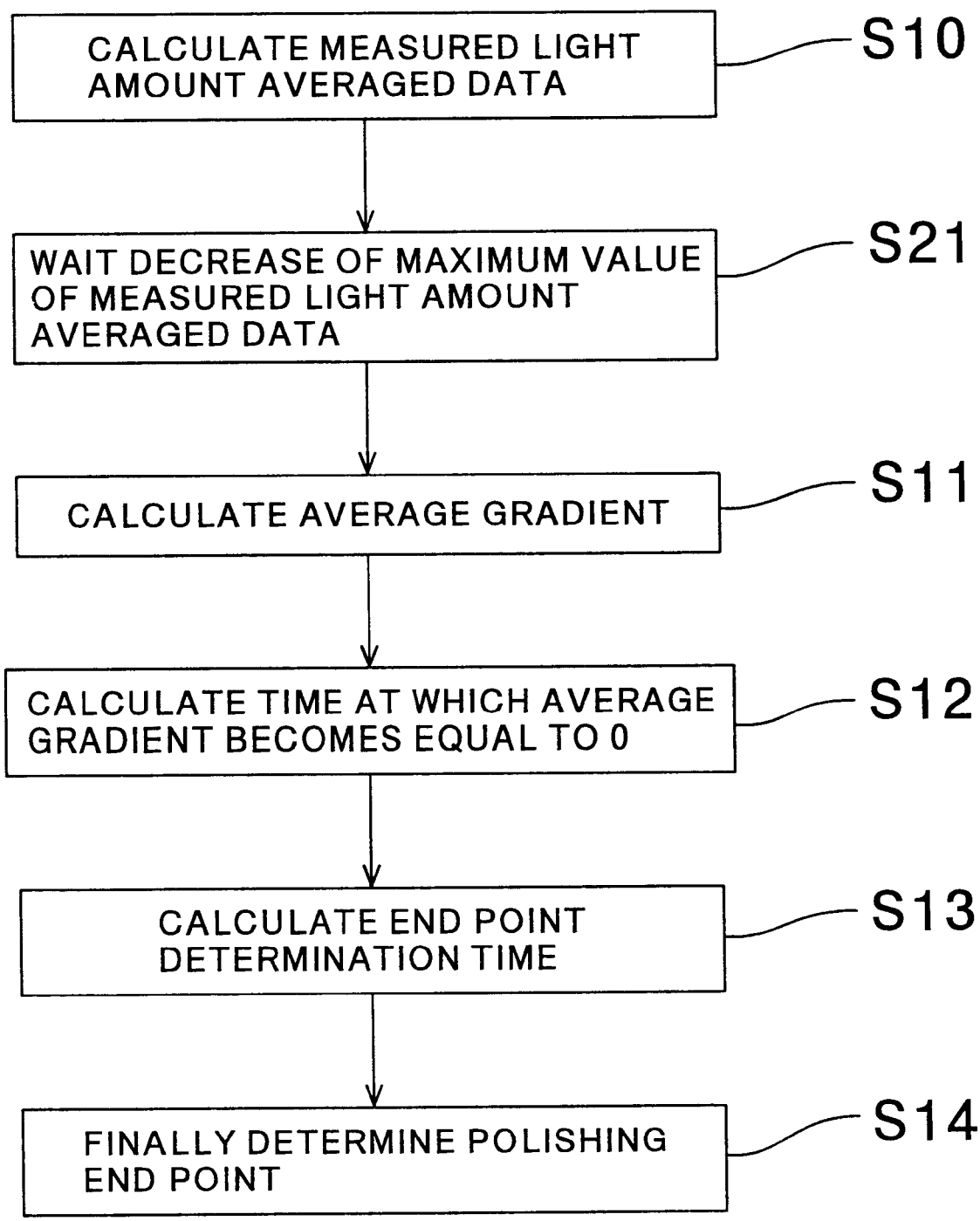

FIG. 12 illustrates a working process end point real time determination method according to the eighth preferred embodiment of the present invention. The working process end point real time determination method of the present embodiment is a yet further modification to and is different from the working process end point real time determination method of the third embodiment described hereinabove with reference to FIG. 6 only in that it additionally includes a 21st step S21 between the tenth step S10 and the eleventh step S11. In the twentieth step S21, a maximum value of the measured light amount averaged data is detected and a ratio between the maximum value and the measured light amount averaged data at the present measurement point of time is calculated, and then it is waited that the ratio becomes a value equal to or less than a threshold value set in advance.

The working process end point real time determination method of the present embodiment is suitably applied particularly where measured light amount averaged data calculated in the tenth step S10 in an initial stage of polishing exhibits a great variation and the polishing end point is likely to be determined in error and besides each wafer exhibits a variation in initial film thickness or in polishing amount per unit time and causes dispersion in time till the polishing end point. It is to be noted that overlapping description of the operations in the other common steps is omitted herein to avoid redundancy.

As described in connection with the working process end point real time determination method of the seventh embodiment above, when the wafer 1 before polishing has some stain or the like on the surface thereof, when the CMP apparatus vibrates, when the slurry at the inspection light irradiation position has a deviation in thickness, or when the polishing amount per unit time varies depending upon a characteristic of the CMP apparatus or a pattern arrangement, the measured light amount averaged data calculated in the tenth step S10 exhibits a great variation particularly in an initial stage of polishing. Accordingly, if the working process end point real time determination method of the third embodiment described hereinabove with reference to FIG. 6 is applied as it is, then wrong determination of the polishing end point occurs.

In addition to such a variation of the measured light amount averaged data in an initial stage of polishing as described above, each wafer may possibly exhibit a variation in initial film thickness or in polishing amount per unit time and causes dispersion in time till the polishing end point. In this instance, if the working process end point real time determination method of the seventh embodiment described hereinabove with reference to FIG. 11 is applied as it is, then since the time until the polishing end point determination operation is started is fixed, if the time before the polishing end point is short, then the polishing end point may possibly come before the polishing end point determination operation is started. On the contrary, if the time before the polishing end point is long, then the polishing end point determination operation may possibly be started while a variation of the measured light amount averaged data in an initial stage of polishing still remains. In either case, wrong determination is invited In order to prevent the wrong determination just described, in the working process end point real time determination method of the present embodiment, when the measured light amount averaged data decreases by a predetermined rate from the maximum value thereof, it is determined that a decrease of the measured light amount averaged data which is a characteristic in the proximity of the polishing end point is started, and before the determination, the polishing end point determination operation in the eleventh step S11 et seq. is not performed to prevent wrong determination.

More particularly, in the 21st step S21, a maximum value of the measured light amount averaged data before the present point of time is detected, and a ratio between the maximum value and the measured light amount averaged data at the present measurement point of time is calculated, and then it is waited that the ratio becomes a value equal to or less than a threshold value set in advance.

It is to be noted, however, that, since wrong determination in an initial stage of polishing cannot be prevented only with the 21st step S21 if the reflected light amount signal exhibits a very great variation in an initial stage of polishing, both of the twentieth step S20 described hereinabove in connection with the working process end point real time determination method of the seventh embodiment of FIG. 11 and the 21st step S21 of the working process end point real time determination method of the present embodiment are used.

Ninth Embodiment

Figure 13:
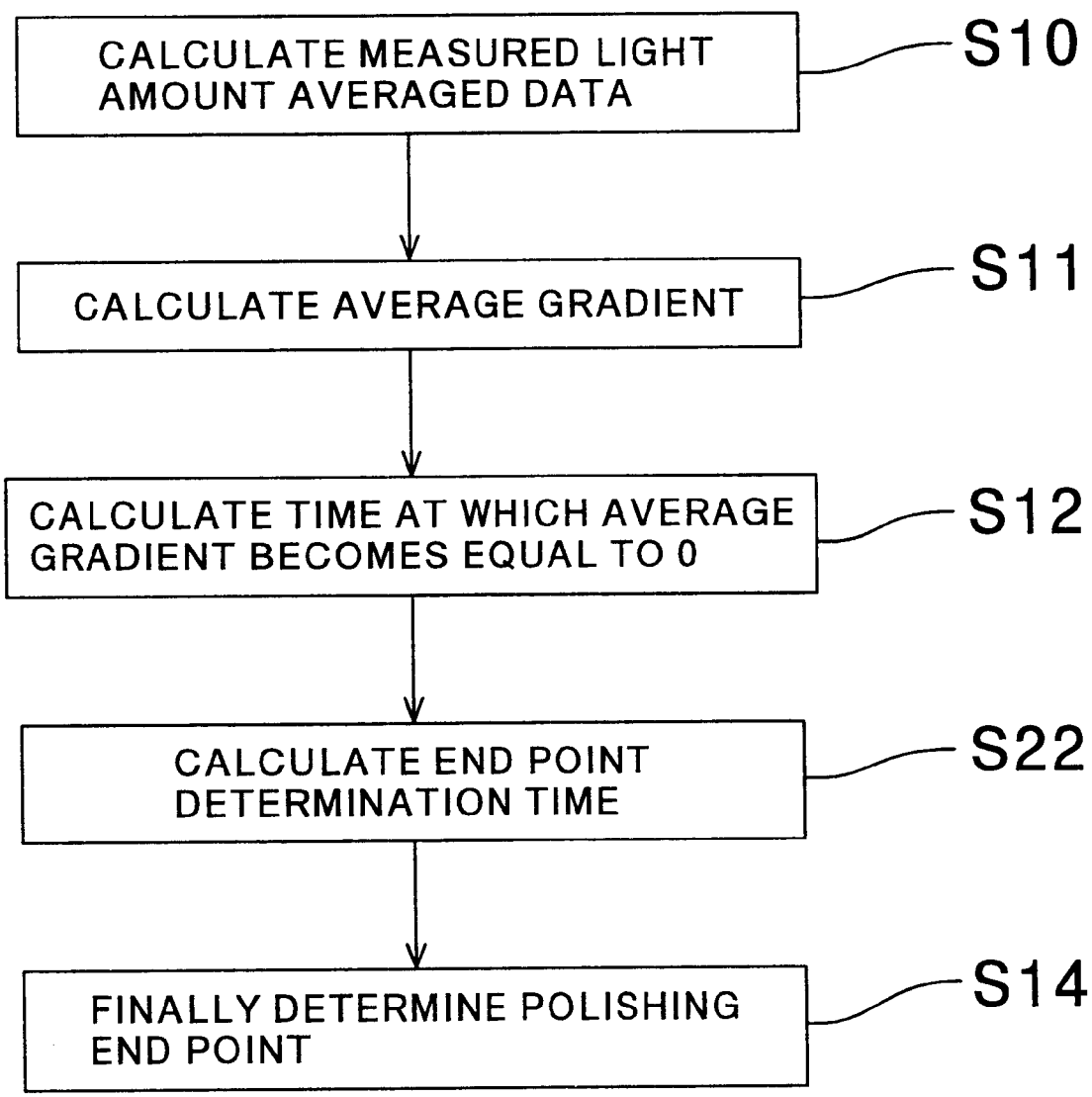

FIG. 13 illustrates a working process end point real time determination method according to the ninth preferred embodiment of the present invention. The working process end point real time determination method of the present embodiment is a yet further modification to and is different from the working process end point real time determination method of the third embodiment described hereinabove with reference to FIG. 6 only in that it includes a 22nd step S22 in place of the thirteenth step S13. In the thirteenth step S13, a time obtained by adding or subtracting a predetermined time to or from a polishing time till the present since the oldest point of time in the past used for the calculation of the average gradient in the eleventh step S11 is subtracted from a time at which the average gradient assumes a value equal to 0 calculated in the twelfth step S12 to calculate the end point determination time.

The working process end point real time determination method of the present embodiment is suitably applied where it is desired to perform determination of the polishing end point at a time earlier or later by a predetermined time than an actual polishing end time. It is to be noted that overlapping description of the operations in the other common steps is omitted herein to avoid redundancy.

The polished condition monitoring apparatus of the reflected light amount measurement type to which the working process end point real time determination method of the present embodiment is applied measures not reflected light from the overall face of the wafer 1 but reflected light only from a predetermined area on a circle of a predetermined radius of the wafer 1. Therefore, even if the wafer 1 is polished somewhat irregularly in a radial direction thereof, the end point determination is disabled. However, if the reflected light amount is measured at a plurality of different radial positions of the wafer 1, then an irregularly polished condition of the wafer 1 can be detected to some degree. However, depending upon the position on the wafer 1, the reflected light amount may not be measured from a mechanical arrangement of the CMP apparatus.

Accordingly, where the wafer 1 is polished irregularly in a radial direction thereof, in order to end polishing completely over the overall area of the wafer 1, it is necessary to perform determination of the polishing end point at a time later by a predetermined time with reference to a portion of the wafer 1 at which the polishing rate is lowest. Further, when it is desired to end polishing in an averaged manner over the overall area of the wafer 1 but the polishing rate is lower in a measurement area of the reflected light amount, determination of the polishing end point must be performed at a time earlier by a predetermined time with reference to a portion of the wafer 1 at which it is polished at an average polishing rate.

Therefore, in the working process end point real time determination method of the present embodiment, upon calculation of the end point determination time, a time obtained by adding or subtracting a predetermined time to or from a polishing time till the present since the oldest point of time in the past used for the calculation of the average gradient in the eleventh step S11 is subtracted from a time at which the average gradient assumes a value equal to 0 calculated in the twelfth step S12 to calculate the end point determination time.

If the predetermined time is added, then since the time to be subtracted from the time at which it is estimated to exhibit the average gradient equal to 0 calculated in the twelfth step S12 increases, the polishing end point determined in the fourteenth step S14 becomes earlier than the actual polishing end time.

On the contrary if the predetermined time is subtracted, then since the time to be subtracted from the time at which it is estimated to exhibit the average gradient equal to 0 calculated in the twelfth step S12 decreases, the polishing end point determined in the fourteenth step S14 becomes later than the actual polishing end time.

Tenth Embodiment

Figure 14:
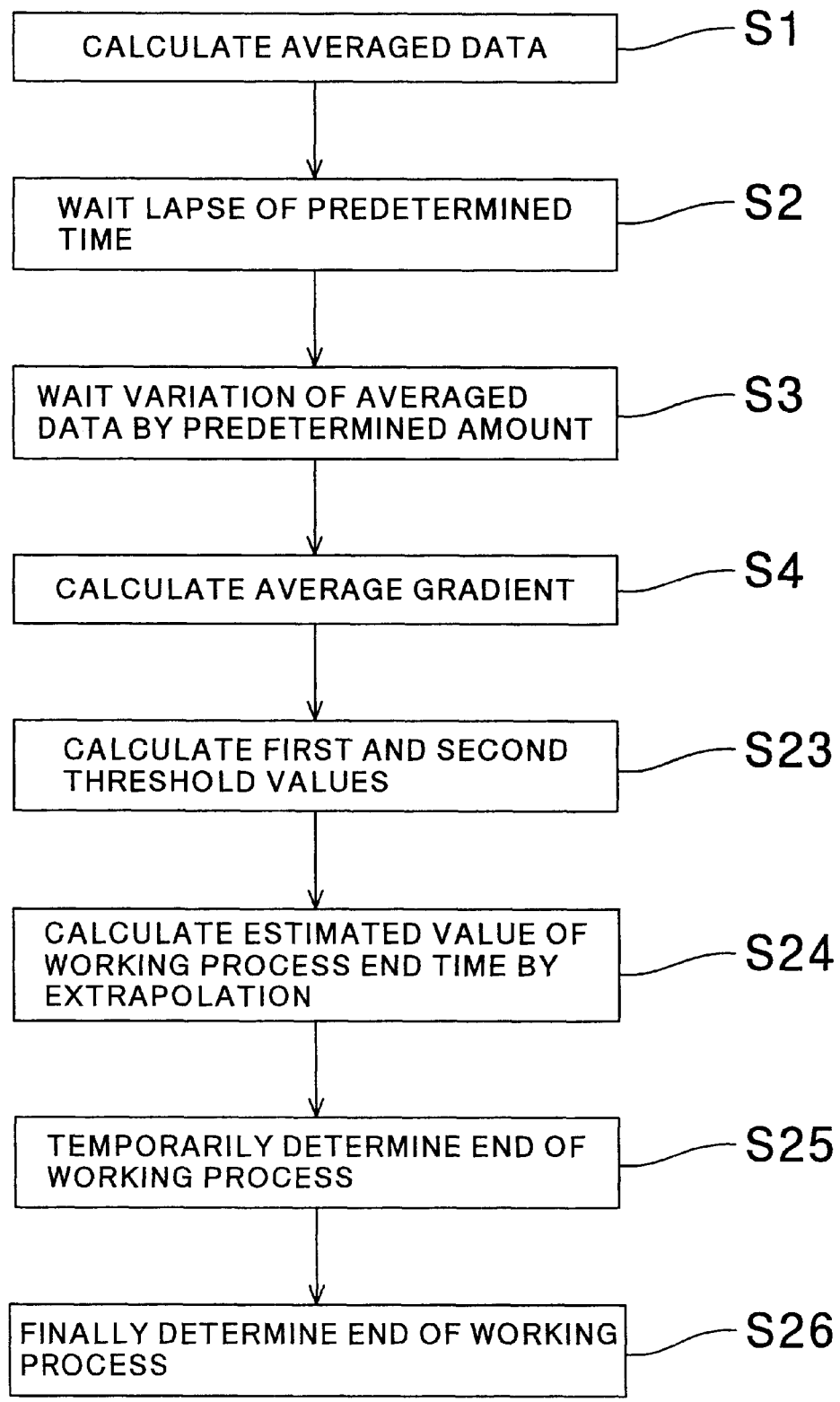

FIG. 14 illustrates a working process end point real time determination method according to the tenth preferred embodiment of the present invention. The working process end point real time determination method of the present embodiment is a modification to and is different from the working process end point real time determination method of the first embodiment described hereinabove with reference to FIG. 1 only in that it includes 23rd to 26th steps S23 to S26 in place of the fifth to seventh steps S5 to S7. It is to be noted that overlapping description of the operations in the other common steps is omitted herein to avoid redundancy.

In the 23rd step S23, a maximum value, a minimum value or an average value of the averaged data obtained for a time between a point of time when a fixed time for excepting a signal variation in an initial stage of the working process elapses and another point of time when the working process measurement signal begins a great variation is multiplied by different predetermined values to calculate relative values as first and second threshold values.

In the 24th step S24, the average gradient value at the present measurement point of time and another one of the average gradient values in the near past after a point of time when an absolute value of the average gradient of the averaged data becomes equal to or higher than the first threshold value are joined to perform extrapolation to the future to calculate a time at which the average gradient becomes equal to zero in the future as an estimated value of a working process end time.

In the 25th step S25, a delay time caused by use of the data in the past is subtracted from the estimated value of the working process end time and it is temporarily determined that the working process has come to an end if the time obtained by the subtraction indicates a time prior to the present measurement point of time.

In the 26th step S26, a short time gradient of the averaged data is calculated only from a value of the averaged data at the present measurement point of time and another value of the averaged data in the nearest past and it is determined that the working process has come to an end from a logical AND between that the short time gradient assumes a value within the second threshold value successively more than a predetermined number of times, that the short time gradient assumes a value within the second threshold value totally by more than the predetermined number of times after the absolute value of the average gradient assumes a value equal to or higher than the first threshold value or that the ratio at which the short time gradient assumes a value within the second threshold value exceeds a predetermined ratio and the determination result in the 25th step S25.

Here, the estimated value of the time before the working process end point calculated in the 24th step S24 in the working process end point real time determination method of the present embodiment includes an error originating from noise and so forth mixed thereto. The error makes a factor of wrong determination in the 25th step S25.

Thus in the 26th step S26, taking it into consideration that some error is involved, a short time gradient of the averaged data of the working process measurement signal is calculated only from a value of the averaged data of the working process measurement signal at the present measurement point of time calculated in the first step S1 and another value of the averaged data in the nearest past and it is determined that the working process has come to an end from a logical AND between that the short time gradient assumes a value within the second threshold value successively more than a predetermined number of times, that the short time gradient assumes a value within the second threshold value totally by more than the predetermined number of times after the absolute value of the average gradient assumes a value equal to or higher than the first threshold value or that the ratio at which the short time gradient assumes a value within the second threshold value exceeds a predetermined ratio and that the time obtained by subtracting a delay time caused by use of the data in the past from the estimated value of the working process end time is prior to the present measurement point of time (determination result in the 25th step S25).

Since the short time gradient described above is calculated with a reduced time in the past and a delay time from an actual working process end point does not occur, if the short time delay comes to a value within the predetermined threshold value, then it can be determined that the working process is in the proximity of the working process end point. Further, since the short time gradient has a great variation, wrong determination arising from a variation of the short time delay can be prevented by determining that the working process comes to an end from a logical AND with the determination result in the 25th step S25 that the working process time is prior to the present measurement point of time. It is to be noted that the method of determining in the 26th step S26 that the short time gradient is in the proximity of 0 and the working process time is in the proximity of the working process end point is not limited to the specific means described above. Anyway, it is required for the determination method to minimize the influence of the variation of the short time gradient.

On the other hand, the determination in the 26th step that the short time gradient assumes a value within the second threshold value totally by more than the predetermined number of times after the absolute value of the average gradient assumes a value equal to or higher than the first threshold value may be replaced by the determination that the short time gradient assumes a value within the second threshold value totally by more than the predetermined number of times after the absolute value of the average gradient assumes a maximum value. In this instance, in such a case that the absolute value of the average gradient assumes a maximum value by a plurality of times before the working process comes to an end, each time a maximum value is detected, the total number of times is reset to re-start counting.

The first and second threshold values to be used in the 24th and 26th steps S24 and S26 are calculated as relative values in the 23rd step by multiplying a maximum value, a minimum value or an average value of the averaged data obtained for a time between a point of time when a fixed time for excepting a signal variation in an initial stage of the working process elapses in the second step S2 and another point of time when the working process measurement signal begins a great variation by different predetermined values.

In such a process that the working process measurement signal has little general variation in magnitude, the first and second threshold values may be fixed values. Further, the reason why the averaged data of the working process signal is used as a reference for calculation of the threshold values is such as follows.

In particular, where the magnitude of the averaged data of the working process measurement signal is generally small, since also the variation amount as the working process proceeds is small, if the determination of the working process end point is performed using the same criterion as that used when the magnitude of the averaged data of the working process measurement signal is generally large, then the detection accuracy is deteriorated. Accordingly, in order to perform determination of the working process end point with an en-equal degree of accuracy even if the magnitude of the averaged data of the working process measurement signal varies as a whole, it is necessary to make the criterion of the working process end point severer as the general magnitude of the averaged data of the working process measurement signal decreases.

In this instance, the variation of the averaged data of the working process measurement signal involves only a variation in magnitude as a whole, and the signal forms are similar to each other. Therefore, the threshold values to be used for the gradient value are calculated as relative values by multiplying a maximum value, a minimum value or an average value of the averaged data of the working process measurement signal by different predetermined values. Consequently, when the averaged data of the working process measurement signal is great, also the determination threshold value is great, but when the averaged data is small, also the determination threshold value is small (severe). Accordingly, the threshold values for the short time gradient data can be calculated as relative values based on the averaged data of the working process measurement signal, and the predetermined value as a coefficient for use for calculation can be determined in the following manner.

First, a standard working process is performed, and based on data obtained then, threshold values with which the working process end point can be determined correctly are determined as reference threshold values. Then, the reference threshold values are divided by a maximum value, a minimum value or an average value of the averaged data of the working process measurement signal used when the reference threshold values are obtained to obtain a predetermined value.

Since the predetermined value is calculated in this manner, if the general magnitude of the averaged data of the working process measurement signal varies with respect to the averaged data of the working process measurement signal when the predetermined value is determined, then the magnitudes of the threshold values for use for determination of the gradient value can be varied in accordance with the amount of the variation.

It is to be noted that the 23rd step S23 in the working process end point real time determination method of the present embodiment may be interposed between the fourth step S4 and the eighth step S8 of the working process end point real time determination method of the second embodiment of FIG. 5 so that relative values may be used for the first and second threshold values to be used in the eighth and ninth steps S8 and S9. In this instance, since the threshold values are formed from relative values, even if the magnitude of the working process measurement signal is varied generally by a difference in a working object, a process condition, a measurement condition or the like, the effect that determination of the working process end point can be performed appropriately can be achieved.

Eleventh Embodiment

Figure 15:
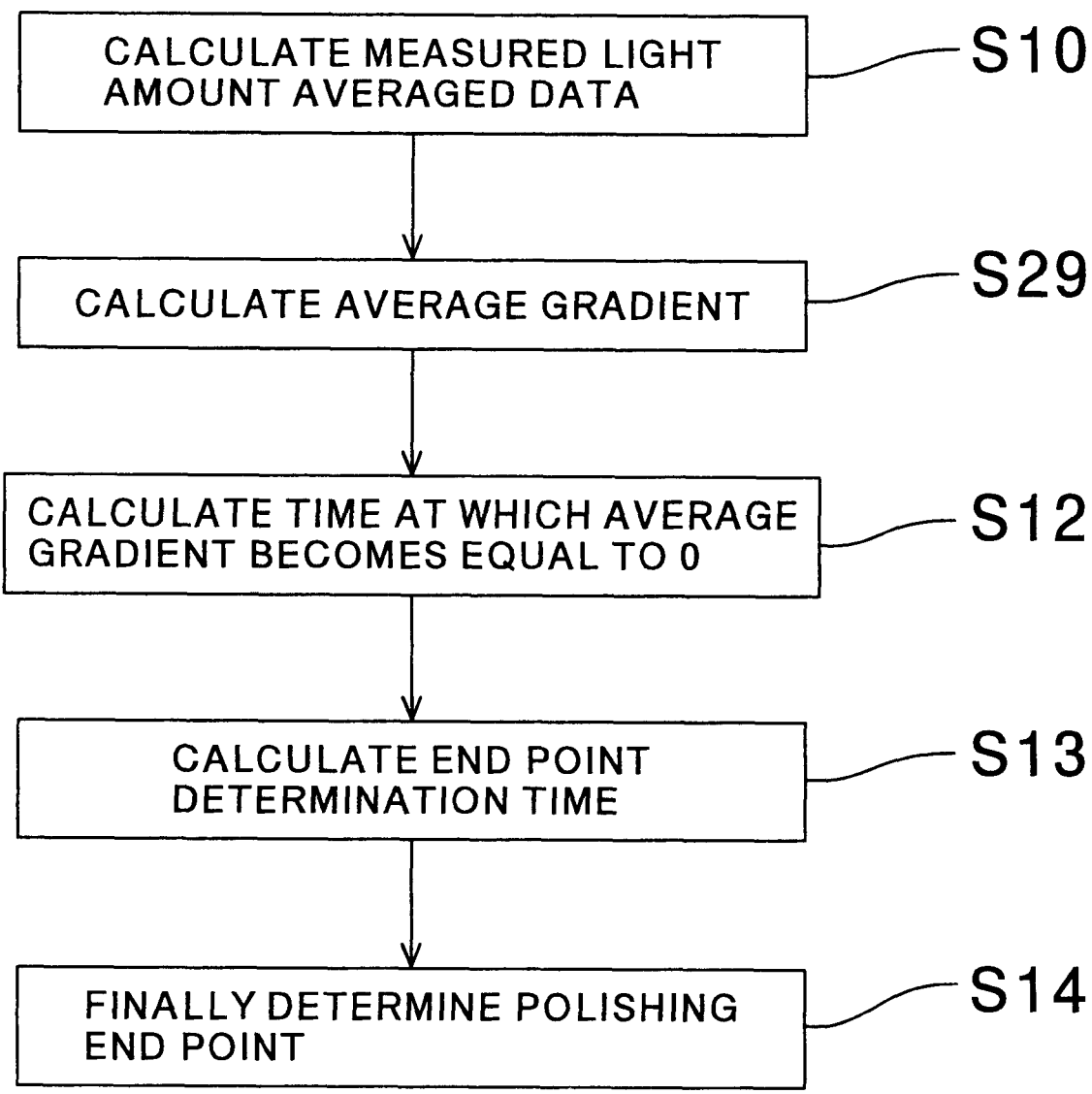

FIG. 15 illustrates a working process end point real time determination method according to the eleventh preferred embodiment of the present invention. The working process end point real time determination method of the present embodiment is a yet further modification to and is different from the working process end point real time determination method of the third embodiment described hereinabove with reference to FIG. 6 only in that it includes a 29th step S29 in place of the eleventh step S11. It is to be noted that overlapping description of the operations in the other common steps is omitted herein to avoid redundancy.

In the 29th step S29, an expression of an approximate straight line is determined by a least square approximation method using a plurality of measured light amount averaged data which belong to a predetermined period in the past including a value of the measured light amount averaged data at the present measurement point of time from among the measured light amount averaged data calculated in the tenth step S10. Since the gradient of the approximate straight line indicates an average rate of change of the plurality of points used for calculation, the gradient of the straight line is calculated as the average gradient.

Twelfth Embodiment

Figure 16:
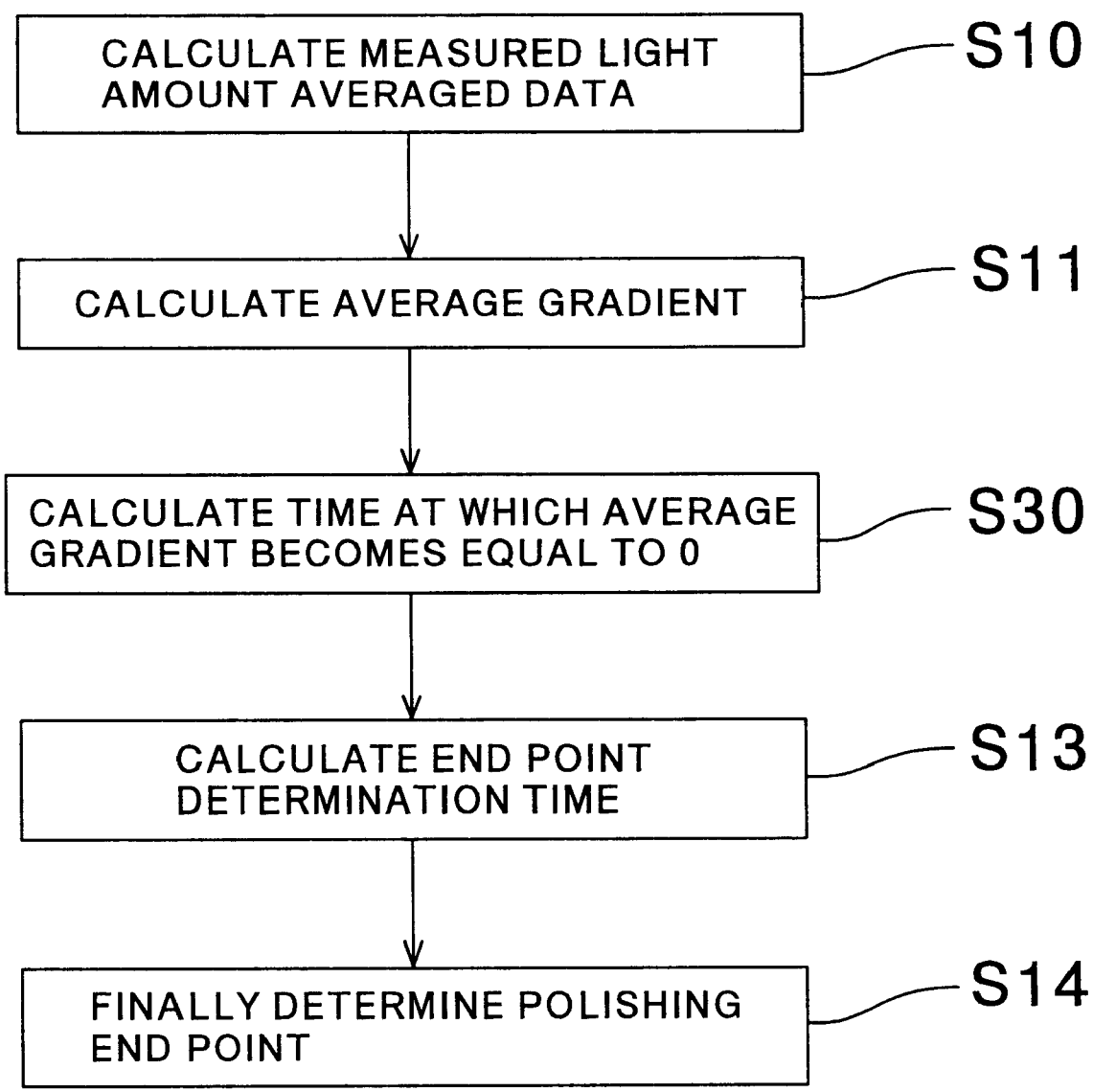

FIG. 16 illustrates a working process end point real time determination method according to the twelfth preferred embodiment of the present invention. The working process end point real time determination method of the present embodiment is a yet further modification to and is different from the working process end point real time determination method of the third embodiment described hereinabove with reference to FIG. 6 only in that it includes, in order to estimate and calculate the point at which the average gradient becomes equal to 0 by extrapolation from a manner of a variation of the average gradient, a 30th step S30 in place of the twelfth step S12. It is to be noted that overlapping description of the operations in the other common steps is omitted herein to avoid redundancy.

In the thirtieth step S30, an expression of a straight line which passes two points of the average gradient of the average gradient data calculated in the eleventh step S11 at the present measurement point of time and another average gradient immediately preceding to the same is determined, and a time at which the average gradient becomes equal to 0 is calculated from the expression of the straight line only when the gradient of the straight line determined is in the negative.

The working process end point real time determination method of the present embodiment is suitably applied where the reflection factors of the films formed on the wafer 1 (FIG. 7) which is used as an object of polishing are reverse to those in the working process end point real time determination method of the third embodiment described hereinabove, that is, where the reflection factor of the metal layer 3 which is applied to the entire face of the wafer I and is polished first is higher than the reflection factor of the insulator layer 2 or the substrate 4 which is exposed as the polishing proceeds.

In the working process end point real time determination method according to the present embodiment, since the variation of the measured light amount averaged data calculated in the tenth step S10 with respect to time is reverse to that in the working process end point real time determination method of the third embodiment and the metal layer 3 having a low reflection factor with respect to the inspection light is applied to the entire face of the wafer 1, the measured light amount averaged data exhibits a low value in an initial stage of the polishing. Then, as the polishing proceeds, the insulator layer 2 having a high reflection factor with respect to the inspection light is exposed and begins to be polished. Or, where the insulator layer 2 is transparent to the inspection light, the inspection light begins to pass through the insulator layer 2 thus exposed and is reflected by the substrate 4 having a high reflection factor. After the working process passes the polishing end point, the reflected light amount increases, and then the measured light amount averaged data does not increase any more after the polishing end point is reached. Accordingly, the average gradient calculated in the eleventh step S11 exhibits a variation wherein it assumes a maximum value at a predetermined point after the increase of the measured light amount averaged data begins and thereafter decreases toward 0. The sign of the average gradient in this instance is opposite to that in the working process end point real time determination method according to the third embodiment.

Therefore, in the thirtieth step S30 for estimation and calculation of the point at which the average gradient becomes equal to 0 by extrapolation from a manner of variation of the average gradient, an expression of a straight line which passes two points of the average gradient at the present measurement point of time and another average gradient immediately preceding to the same is determined. If the gradient of the straight line determined is in the positive, then the time at which the average gradient becomes equal to 0 is not calculated.

Such a situation as described above occurs even depending upon selection of the wavelength of the inspection light. The different layers on the wafer 1 have different spectral reflection factors from one another and the reflection factors of the layers with respect to a single predetermined wavelength are different from one another. Accordingly, if monochromatic light is used for the inspection light, then depending upon the selected wavelength, the reflection factor of the metal layer 3 which is applied to the overall face of the wafer 1 and is polished first may be higher than the reflection factor of the insulator layer 2 or the substrate 4 which is exposed as the polishing proceeds as in the working process end point real time determination method of the third embodiment, or the reflection factor of the metal layer 3 which is applied to the overall face of the wafer 1 and is polished first may be lower than the reflection factor of the insulator layer 2 or the substrate 4 which is exposed as the polishing proceeds as in the working process end point real time determination method of the present embodiment.

Thirteenth Embodiment

Figure 17:
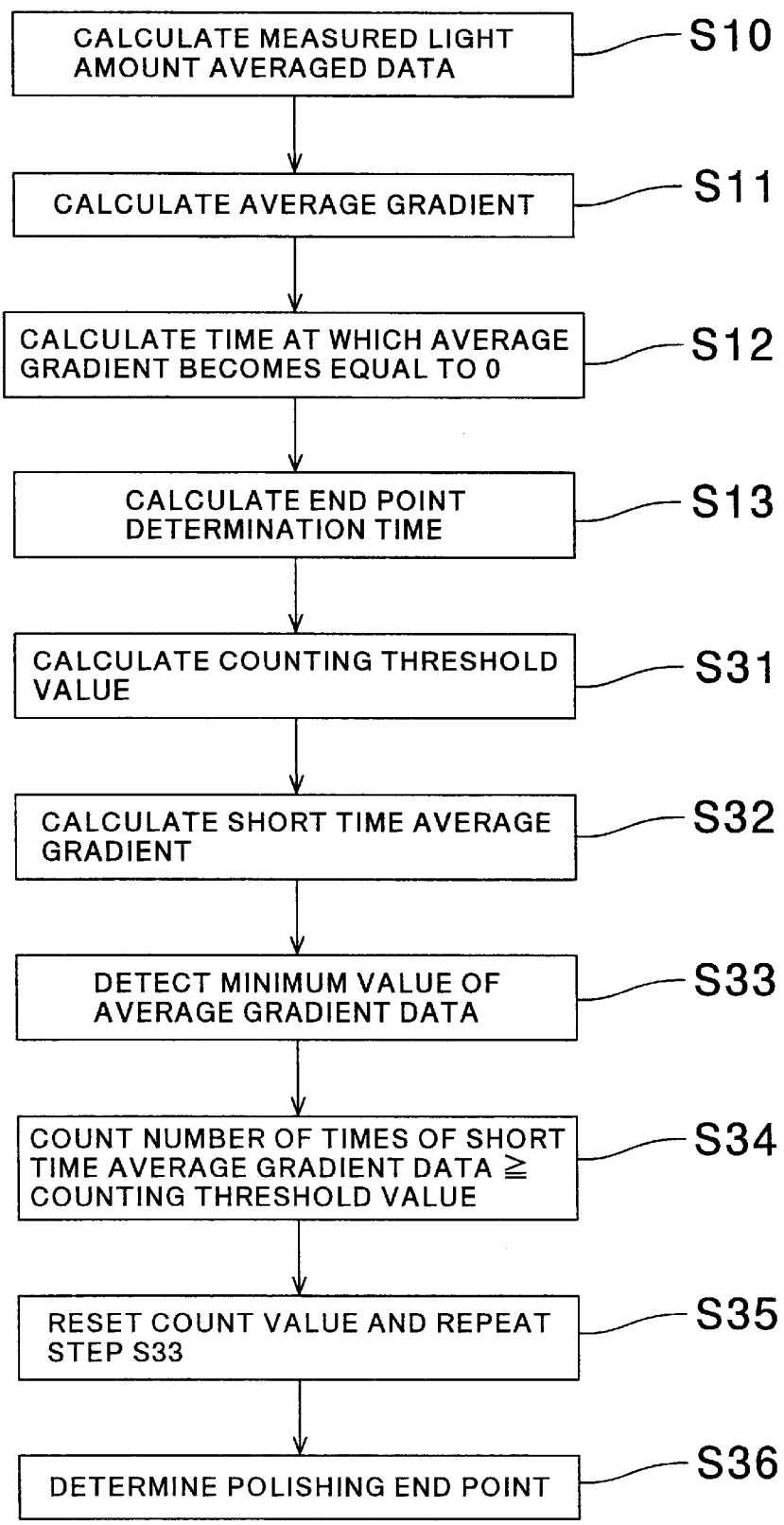

FIG. 17 illustrates a working process end point real time determination method according to the thirteenth preferred embodiment of the present invention. The working process end point real time determination method of the present embodiment is a yet further modification to and is different from the working process end point real time determination method of the third embodiment described hereinabove with reference to FIG. 6 only in that it includes 31st to 36th steps S31 to S36 in place of the twelfth step S14. It is to be noted that overlapping description of the operations in the other common steps is omitted herein to avoid redundancy.

Depending upon the structure of the wafer or the polishing characteristic of the CMP apparatus, when the point at which the average gradient becomes equal to 0 is to be estimated and calculated by extrapolation from a manner of the variation of the average gradient calculated in the eleventh step S11, it may not be estimated or calculated correctly with an expression of a straight line. Particularly where the polishing rate is low in the proximity of the polishing end point and the average gradient approaches 0 moderately in the proximity of the polishing end point, if the time is estimated with an expression of a straight line, then the polishing end point determined is earlier than an actual polishing end point. The working process end point real time determination method of the present embodiment prevents the wrong determination just described.

In the 31st step S31 next to the thirteenth step S13, a maximum value or an average value of the measured light amount averaged data obtained for a time after a fixed time for excepting a signal variation in an initial stage of the polishing elapses until the measured light amount averaged data begins to decrease a great amount is multiplied by a predetermined value to calculate a relative value as a threshold value.

In the 32nd step S32, an average value of a plurality of ones of the measured light amount averaged data calculated in the tenth step S10 which belong to a predetermined period in the past including the value of the measured light amount averaged data at the present measurement point of time and another average value of another plurality of ones of the measured light amount averaged data which belong to another predetermined period in the further past are calculated, and a variation amount per unit time between the two average values is calculated as an average gradient in a short time. In short, an average gradient is calculated in a similar manner as in the eleventh step S11. In this instance, however, the short time gradient of the measured light amount averaged data is calculated only from the value at the present measurement point of time and the value at the nearest past. Since the short time average gradient is calculated with a reduced number of points in the past used for the calculation, it has a great variation, and if the polishing end point is determined only with the short time gradient, then wrong determination is likely to occur. However, the difference between the time at which the average inclination in the short time becomes equal to 0 and an actual polishing end time is so small that wrong determination is not likely to occur.

In the 33rd step, it is determined that the average gradient data calculated in the eleventh step S11 assumes a minimum value.

In the 34th step S34, an accumulated value of the number of times by which the average gradient data in the short time calculated in the 32nd step 32S assumes a value within the counter threshold value calculated in the 31st step S31 after it is determined in the 33rd step S33 that the average gradient data calculated in the eleventh step S11 assumes a minimum value is counted. Since the difference between the time at which the average inclination in the short time becomes equal to 0 and an actual polishing end time is small and the counting is started in the proximity of the actual polishing end time, it can be determined that the polishing process is in the proximity of the polishing end point if the count value is equal to or greater than a predetermined number.

However, although, depending upon the structure of the wafer or the polishing characteristic of the CMP apparatus, the average gradient data calculated in the eleventh step S11 sometimes assumes a minimum value by a plurality of times before polishing comes to an end, it is desired to actually start counting at a point of time at which a minimum value is assumed immediately prior to the end of the polishing. Therefore, in the 35th step, if the average gradient data calculated in the eleventh step S11 assumes a maximum value after it is determined in the 33rd step S33 that the average gradient data assumes a minimum value, the accumulated value counted in the 34th step S34 is reset and the minimum value detection in the 33rd step S33 is repeated.

Finally in the 36th step S36, the end point determination time calculated in the thirteenth step S13 and the present polishing time are compared with each other, and it is determined that the polishing end time comes if the end point determination time is equal to or smaller than the present polishing time and the number of times by which the average gradient in the short time counted in the 34th step S34 assumes a value within the counting threshold value is equal to or greater than a predetermined number.

Thus, in the 36th step S36, the polishing end point is determined with a logical AND between the criterion of the polishing end point described hereinabove in the working process end point real time determination method of the third embodiment with reference to FIG. 6 and the condition that the number of times by which the average gradient in the short time assumes a value within the counting threshold value is equal to or greater than the predetermined number. If the polishing rate in the proximity of the polishing end point is low and the average gradient approaches 0 moderately in the proximity of the polishing end point, then if the polishing end time is estimated only with the criterion of the working process end point real time determination method of the third embodiment, then the polishing end point determined becomes earlier than an actual polishing end point. In other words, if the time at which the average gradient becomes equal to 0 is estimated with an expression of a straight line, then the polishing end point determined becomes earlier than an actual polishing end point. At this point of time, since the number of times by which the average gradient in the short time assumes a value within the counter threshold value does not become equal to or greater than the predetermined number, wrong determination can be prevented.

It is to be noted that the reason why the counting threshold value is calculated as a relative value obtained by multiplying a maximum value or an average value of the measured light amount averaged data obtained for a time after a fixed time for excepting a signal variation in an initial stage of the polishing elapses until the measured light amount averaged data begins to decrease a great amount is that, even if the magnitude of the reflected light amount signal is varied generally by a difference in the type of the semiconductor wafer or a process condition and a measurement condition arising from the light amount of the light source or deterioration of the measurement light path, determination of the working process end point can be performed appropriately.

Fourteenth Embodiment

Figure 18:
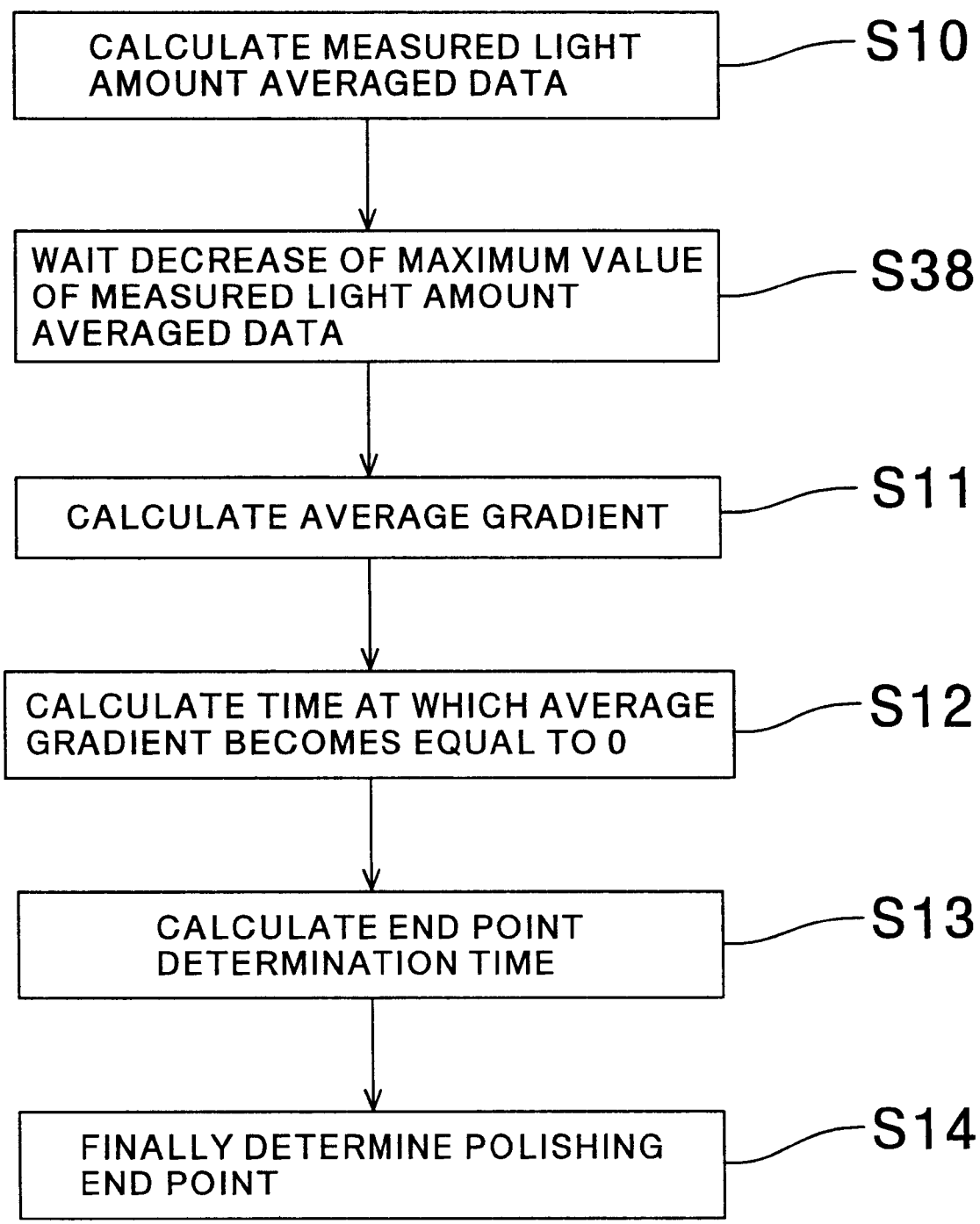
Figure 19:
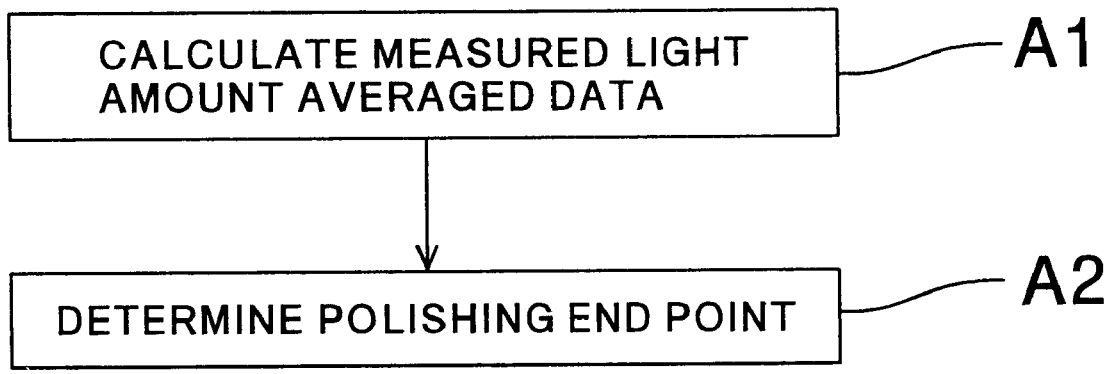
FIG. 19 is a flow chart illustrating an example of a conventional working process end point real time determination method.

FIG. 18 illustrates a working process end point real time determination method according to the fourteenth preferred embodiment of the present invention. The working process end point real time determination method of the present embodiment is a yet further modification to and is different from the working process end point real time determination method of the third embodiment described hereinabove with reference to FIG. 6 only in that it additionally includes a 38th step S38 interposed between the tenth step S10 and the eleventh step S11. It is to be noted that overlapping description of the operations in the other common steps is omitted herein to avoid redundancy.

The working process end point real time determination method of the present embodiment is suitably applied particularly where measured light amount averaged data calculated in the tenth step S10 in an initial stage of polishing exhibits a great variation and the polishing end point is likely to be determined in error and besides each wafer exhibits a variation in initial film thickness or in polishing amount per unit time and causes dispersion in time till the polishing end point.

As described also in connection with the working process end point real time determination method of the seventh embodiment above, when the wafer 1 before polishing has some stain on the surface thereof, when the CMP apparatus vibrates, when the slurry at the inspection light irradiation position has a deviation in thickness, or when the polishing amount per unit time varies depending upon a characteristic of the CMP apparatus or a pattern arrangement, the measured light amount averaged data calculated in the tenth step S10 exhibits a great variation particularly in an initial stage of polishing. Accordingly, if the working process end point real time determination method of the third embodiment described hereinabove with reference to FIG. 6 is applied as it is, then wrong determination of the polishing end point occurs.

In addition to the variation of the measured light amount averaged data in an initial stage of polishing, each wafer may possibly exhibit a variation in initial film thickness or in polishing amount per unit time and causes dispersion in time till the polishing end point. In this instance, since the time until the polishing end point determination operation is started is fixed in the working process end point real time determination method of the third embodiment, if the time before the polishing end point is short, then the polishing end point may possibly come before the polishing end point determination operation is started. On the contrary, if the time before the polishing end point is long, then the polishing end point determination operation may possibly be started while a variation of the measured light amount averaged data in an initial state of polishing still remains. In either case, wrong determination is invited In order to prevent the wrong determination just described, in the working process end point real time determination method of the present embodiment, when the measured light amount averaged data decreases by a predetermined ratio from the maximum value thereof, it is determined that a decrease of the measured light amount averaged data which is a characteristic in the proximity of the polishing end point is started, and before the determination, the polishing end point determination operation in the eleventh step S11 et seq. is not performed.

More particularly, in the 38th step S38, a maximum value of the measured light amount averaged data up to the present point of time is detected, and a ratio between the maximum value and the measured light amount averaged data at the present measurement point of time is calculated. Then, it is waited that the ratio becomes equal to or lower than a threshold value set in advance. However, where the reflected light amount signal exhibits a very great variation in an initial stage of the polishing, it is difficult to prevent possible wrong determination only with the 38th step S38. In this instance, it is preferable to use both of the 37th step S37 used in the working process end point real time determination method of the thirteenth embodiment of FIG. 17 and the 38th step S38 used in the working process end point real time determination method of the present embodiment.

In the working process end point real time determination method of any of the first to fourteenth embodiments described above, the working process measurement signal obtained from the working process measuring instrument varies, while having a variation, by a great amount once as the working process proceeds, and then enters a steady state when a predetermined working process is completed. Accordingly, determination of the end of the working process can be obtained by detecting the point at which the transition into the steady state comes to an end from the working process measurement signal having a variation.

As described above, according to the working process end point real time determination method of the present invention, based on a working process measurement signal which is obtained from various types of working process measuring instruments and includes a variation, it can be determined on the real time basis while the working process is proceeding that a point of time at which the working process measurement signal completes its transition into a steady state after a great variation of the working process signal as the working process proceeds is experienced.

While preferred embodiments of the present invention have been described using specific terms, the working process end point real time determination method of the present invention not limited to the specific embodiments, and it is to be understood that changes and variations may be made to the embodiments of the working process end point real time determination method without departing from the spirit or scope of the following claims.

What is claimed is:

1. A working process end point real time determination method, comprising:

a first step of averaging a working process measurement signal obtained from a working process measuring instrument and indicating the progress of a working process at intervals equal to an integral number of times a predetermined period to discretely calculate an average value for each interval equal to the integral number of times the predetermined period as averaged data;

a second step of successively comparing a working process elapsed time up to the present with a predetermined time set in advance and waiting that the working process elapsed time up to the present exceeds the predetermined time set in advance;

a third step of waiting that the averaged data of the working process measurement signal calculated in the first step reaches a predetermined value or a predetermined multiple;

a fourth step of calculating an average gradient over a plurality of ones of the averaged data of the working process measurement signal calculated in the first step which belong to a predetermined period in the past including the value of the averaged data at the present measurement point of time;

a fifth step of joining, after an absolute value of the average gradient of the averaged data of the working process measurement signal calculated in the fourth step assumes a value equal to or higher than a first threshold value set in advance, the average gradient at the present measurement point of time and another one of the average gradients in the near past to perform extrapolation to the future to calculate an estimated value of time until the working process comes to an end;

a sixth step of subtracting a delay time caused by use of the data in the past from the estimated value up to the end of the working process calculated in the fifth step and temporarily determining that the working process has come to an end if the time obtained by the subtraction indicates a time prior to the present measurement point of time; and a seventh step of calculating a short time gradient of the averaged data of the working process measurement signal only from a value at the present measurement point of time and the nearest data in the past from within the averaged data of the working process measurement signal calculated in the first step and determining that the working process has come to an end from a logical AND between when the short time gradient reaches a value within a second threshold value set in advance successively more than a predetermined number of times, that the short time gradient exhibits a value-within the second threshold value totally by more than the predetermined number of times after the average gradient assumes a maximum value or that the ratio at which the short time gradient assumes a value within the second threshold value is equal to or higher than a predetermined ratio and that a time obtained by subtracting the delay time caused by use of the data in the past from the estimated value up to the end of the working process indicates a time prior to the present measurement point of time.

2. A working process end point real time determination method as claimed in claim 1, wherein, in the first step, the working process measurement signal is averaged after each time interval within which a working object makes one rotation.

3. A working process end point real time determination method as claimed in claim 1, wherein, in the first step, the working process measurement signal is averaged after each time interval within which a working object makes an integral number of rotations.

4. A working process end point real time determination method as claimed in claim 1, wherein, in the first step, the averaging of the working process measurement signal only over a predetermined interval of time within a time within which a working object makes one rotation is performed after each period of rotation of the working object.

5. A working process end point real time determination method as claimed in claim 1, wherein, in the first step, the working process measurement signal is averaged at time intervals within which inspection light scans a working object.

6. A working process end point real time determination method as claimed in claim 1, wherein, in the fourth step, an average value of a plurality of ones of the averaged data which belong to a predetermined period in the past including the value of the averaged data at the present measurement point of time and an average value of another plurality of ones of the averaged data which belong to another predetermined period in the further past are calculated, and a variation amount per unit time between the two average values is calculated as the average gradient.

7. A working process end point real time determination method as claimed in claim 1, wherein, in the fourth step, an expression of a straight line is determined by a least square approximation method using a plurality of averaged data of a measured light amount which belong to a predetermined period in the past including a value of the measured light amount averaged data at the present measurement point of time, and a gradient of the straight line is calculated as the average gradient.

8. A working process end point real time determination method as claimed in claim 1, wherein, in the fifth step, an expression of a straight line which passes two points of the average gradient at the present measurement point of time and another average gradient immediately preceding to the same is determined, and a time at which the average gradient becomes equal to 0 is calculated from the expression of the straight line only when the gradient of the straight line determined is in the positive if the averaged data exhibits a variation with respect to time wherein the averaged data drops by a great amount once and then enters a steady state or only when the gradient of the straight line determined is in the negative if the averaged data exhibits another variation with respect to time wherein the averaged data rises by a great amount once and then enters a steady state.

9. A working process end point real time determination method as claimed in claim 1, wherein, in the fifth step, an expression of a straight line is determined by a least square approximation method using three or more average gradients of the averaged data which belong to the past including the average gradient at the present measurement point of time, and a time at which the average gradient becomes equal to 0 is calculated from the expression of the straight line only when the gradient of the straight line determined is in the positive if the averaged data exhibits a variation with respect to time wherein the averaged data drops by a great amount once and then enters a steady state or only when the gradient of the straight line determined is in the negative if the averaged data exhibits another variation with respect to time wherein the averaged data rises by a great amount once and then enters a steady state.

10. A working process end point real time determination method as claimed in claim 1, wherein an average gradient in a short time including a comparatively small number of averaged data in the past is calculated and the number of times by which the average gradient in the short time assumes a value equal to or greater than 0 is counted, and it is determined that the working end point comes if the calculated end point determination time is smaller than the present working time and the count number by which the relationship that the average gradient in the short time is equal to or greater than 0 is satisfied is equal to or greater than a predetermined number.

11. A working process end point real time determination method as claimed in claim 1, wherein a predetermined time which exceeds a time within which a great variation of the averaged data in an initial stage of the working occurs is set in advance, and the predetermined time and the working elapsed time till the present are compared with each other and then the working end point determination operation is not performed until the present working elapsed time becomes equal to or greater than the predetermined time set in advance.

12. A working process end point real time determination method as claimed in claim 1, wherein a maximum value of the averaged data till the present measurement point of time is determined, and the working end point determination operation is not performed until it is determined, when the averaged data drops by a predetermined ratio from the maximum value, that a drop of the averaged data which is a characteristic of the averaged data in the proximity of the working end point has started.

13. A working process end point real time determination method as claimed in claim 1, wherein, when the end point determination time is to be calculated, a time obtained by adding or subtracting a predetermined time to or from a working time till the present since the oldest point of time in the past used for the calculation of the average gradient is subtracted from a time at which the average gradient assumes a value equal to 0 to calculate the end point determination time thereby to delay or advance the determination of the working end point by a predetermined time.

14. A working process end point real time determination method, comprising:

a first step of averaging a working process measurement signal obtained from a working process measuring instrument and indicating the progress of a working process at intervals equal to an integral number of times a predetermined period to discretely calculate an average value for each interval equal to the integral number of times the predetermined period as averaged data;

a second step of successively comparing a working process elapsed time up to the present with a predetermined time set in advance and waiting that the working process elapsed time up to the present exceeds the predetermined time set in advance;

a third step of waiting that the averaged data of the working process measurement signal calculated in the first step reaches a predetermined value or a predetermined multiple;

a fourth step of calculating an average gradient over a plurality of ones of the averaged data of the working process measurement signal calculated in the first step which belong to a predetermined period in the past including the value of the averaged data at the present measurement point of time;

an eighth step of waiting that an absolute value of the average gradient of the averaged data of the working process measurement signal calculated in the fourth step becomes equal to or higher than a first threshold value set in advance; and a ninth step of calculating a short time gradient of the averaged data of the working process measurement signal only from the value at the present measurement point of time and the value in the nearest past of the averaged data of the working process measurement signal calculated in the first step after the absolute value of the average gradient of the averaged data of the working process measurement signal calculated in the fourth step becomes equal to or higher than the first threshold value and determining that the working process has come to an end if the short time gradient reaches a value within a second threshold value set in advance successively more than a predetermined number of times, if the short time gradient assumes a value within the second threshold value totally by more than the predetermined number of times after the absolute value of the average gradient becomes equal to or higher than the first threshold value or if the ratio at which the short time gradient assumes a value within the second threshold value is equal to or higher than a predetermined ratio.

15. A working process end point real time determination method as claimed in claim 14, wherein, in the first step, the working process measurement signal is averaged after each time interval within which a working object makes one rotation.

16. A working process end point real time determination method as claimed in claim 14, wherein, in the first step, the working process measurement signal is averaged after each time interval within which a working object makes an integral number of rotations.

17. A working process end point real time determination method as claimed in claim 14, wherein, in the first step, the averaging of the working process measurement signal only over a predetermined interval of time within a time within which a working object makes one rotation is performed after each period of rotation of the working object.

18. A working process end point real time determination method as claimed in claim 14, wherein, in the first step, the working process measurement signal is averaged at time intervals within which inspection light scans a working object.

19. A working process end point real time determination method as claimed in claim 14, wherein, in the fourth step, an average value of a plurality of ones of the averaged data which belong to a predetermined period in the past including the value of the averaged data at the present measurement point of time and an average value of another plurality of ones of the averaged data which belong to another predetermined period in the further past are calculated, and a variation amount per unit time between the two average values is calculated as the average gradient.

20. A working process end point real time determination method as claimed in claim 14, wherein, in the fourth step, an expression of a straight line is determined by a least square approximation method using a plurality of averaged data of a measured light amount which belong to a predetermined period in the past including a value of the measured light amount averaged data at the present measurement point of time, and a gradient of the straight line is calculated as the average gradient.

21. A working process end point real time determination method as claimed in claim 14, wherein an average gradient in a short time including a comparatively small number of averaged data in the past is calculated and the number of times by which the average gradient in the short time assumes a value equal to or greater than 0 is counted, and it is determined that the working end point comes if the calculated end point determination time is smaller than the present working time and the count number by which the relationship that the average gradient in the short time is equal to or greater than 0 is satisfied is equal to or greater than a predetermined number.

22. A working process end point real time determination method as claimed in claim 14, wherein a predetermined time which exceeds a time within which a great variation of the averaged data in an initial stage of the working occurs is set in advance, and the predetermined time and the working elapsed time till the present are compared with each other and then the working end point determination operation is not performed until the present working elapsed time becomes equal to or greater than the predetermined time set in advance.

23. A working process end point real time determination method as claimed in claim 14, wherein a maximum value of the averaged data till the present measurement point of time is determined, and the working end point determination operation is not performed until it is determined, when the averaged data drops by a predetermined ratio from the maximum value, that a drop of the averaged data which is a characteristic of the averaged data in the proximity of the working end point has started.

24. A working process end point real time determination method as claimed in claim 14, wherein, when the end point determination time is to be calculated, a time obtained by adding or subtracting a predetermined time to or from a working time till the present since the oldest point of time in the past used for the calculation of the average gradient is subtracted from a time at which the average gradient assumes a value equal to 0 to calculate the end point determination time thereby to delay or advance the determination of the working end point by a predetermined time.

25. A working process end point real time determination method, comprising:

a first step of averaging a working process measurement signal obtained from a working process measuring instrument and indicating the progress of a working process at intervals equal to an integral number of times a predetermined period to discretely calculate an average value for each interval equal to the integral number of times the predetermined period as averaged data;

a second step of successively comparing a working process elapsed time up to the present with a predetermined time set in advance and waiting that the working process elapsed time up to the present exceeds the predetermined time set in advance;

a third step of waiting that the averaged data of the working process measurement signal calculated in the first step reaches a predetermined value or a predetermined multiple;

a fourth step of calculating an average gradient over a plurality of ones of the averaged data of the working process measurement signal calculated in the first step which belong to a predetermined period in the past including the value of the averaged data at the present measurement point of time;

a 23rd step of multiplying a maximum value, a minimum value or an average value of the averaged data obtained for a time between a point of time when a fixed time for excepting a signal variation in an initial stage of the working process elapses and another point of time when the working process measurement signal begins a great variation by different predetermined values to calculate relative values as first and second threshold values;

a 24th step of joining the average gradient value at the present measurement point of time and another one of the average gradient values in the near past after a point of time when an absolute value of the average gradient of the averaged data becomes equal to or higher than the first threshold value to perform extrapolation to the future to calculate a time at which the average gradient becomes equal to zero in the future as an estimated value of a working process end time;

a 25th step of subtracting a delay time caused by use of the data in the past from the estimated value of the working process end time and temporarily determining that the working process has come to an end if the time obtained by the subtraction indicates a time prior to the present measurement point of time; and a 26th step of calculating a short time gradient of the averaged data only from a value of the averaged data at the present measurement point of time and another value of the averaged data in the nearest past and determining that the working process has come to an end from a logical AND between when the short time gradient assumes a value within the second threshold value successively more than a predetermined number of times, that the short time gradient assumes a value within the second threshold value totally by more than the predetermined number of times after the absolute value of the average gradient assumes a value equal to or higher than the first threshold value or that the ratio at which the short time gradient assumes a value within the second threshold value exceeds a predetermined ratio and the determination result in the 25th step.

26. A working process end point real time determination method as claimed in claim 25, wherein, in the first step, the working process measurement signal is averaged after each time interval within which a working object makes one rotation.

27. A working process end point real time determination method as claimed in claim 25, wherein, in the first step, the working process measurement signal is averaged after each time interval within which a working object makes an integral number of rotations.

28. A working process end point real time determination method as claimed in claim 25, wherein, in the first step, the averaging of the working process measurement signal only over a predetermined interval of time within a time within which a working object makes one rotation is performed after each period of rotation of the working object.

29. A working process end point real time determination method as claimed in claim 25, wherein, in the first step, the working process measurement signal is averaged at time intervals within which inspection light scans a working object.

30. A working process end point real time determination method as claimed in claim 25, wherein, in the fourth step, an average value of a plurality of ones of the averaged data which belong to a predetermined period in the past including the value of the averaged data at the present measurement point of time and an average value of another plurality of ones of the averaged data which belong to another predetermined period in the further past are calculated, and a variation amount per unit time between the two average values is calculated as the average gradient.

31. A working process end point real time determination method as claimed in claim 25, wherein, in the fourth step, an expression of a straight line is determined by a least square approximation method using a plurality of averaged data of a measured light amount which belong to a predetermined period in the past including a value of the measured light amount averaged data at the present measurement point of time, and a gradient of the straight line is calculated as the average gradient.

32. A working process end point real time determination method as claimed in claim 25, wherein an average gradient in a short time including a comparatively small number of averaged data in the past is calculated and the number of times by which the average gradient in the short time assumes a value equal to or greater than 0 is counted, and it is determined that the working end point comes if the calculated end point determination time is smaller than the present working time and the count number by which the relationship that the average gradient in the short time is equal to or greater than 0 is satisfied is equal to or greater than a predetermined number.

33. A working process end point real time determination method as claimed in claim 25, wherein a predetermined time which exceeds a time within which a great variation of the averaged data in an initial stage of the working occurs is set in advance, and the predetermined time and the working elapsed time till the present are compared with each other and then the working end point determination operation is not performed until the present working elapsed time becomes equal to or greater than the predetermined time set in advance.

34. A working process end point real time determination method as claimed in claim 25, wherein a maximum value of the averaged data till the present measurement point of time is determined, and the working end point determination operation is not performed until it is determined, when the averaged data drops by a predetermined ratio from the maximum value, that a drop of the averaged data which is a characteristic of the averaged data in the proximity of the working end point has started.

35. A working process end point real time determination method as claimed in claim 25, wherein, when the end point determination time is to be calculated, a time obtained by adding or subtracting a predetermined time to or from a working time till the present since the oldest point of time in the past used for the calculation of the average gradient is subtracted from a time at which the average gradient assumes a value equal to 0 to calculate the end point determination time thereby to delay or advance the determination of the working end point by a predetermined time.

36. A working process end point real time determination method as claimed in claim 25, wherein, when it is determined that the short time gradient exhibits a value within the predetermined threshold value totally by more than the predetermined number of times after the absolute value of the average gradient exhibits a maximum value, in such a process that the absolute value of the average gradient assumes a maximum value by a plurality of times before the working process comes to an end, each time a maximum value is detected, the total number of times is reset to re-start counting.

37. A working process end point real time determination method, comprising:
 a first step of averaging a working process measurement signal obtained from a working process measuring instrument and indicating the progress of a working process at intervals equal to an integral number of times a predetermined period to discretely calculate an average value for each interval equal to the integral number of times the predetermined period as averaged data;
 a second step of successively comparing a working process elapsed time up to the present with a predetermined time set in advance and waiting that the working process elapsed time up to the present exceeds the predetermined time set in advance;
 a third step of waiting that the averaged data of the working process measurement signal calculated in the first step reaches a predetermined value or a predetermined multiple;
 a fourth step of calculating an average gradient over a plurality of ones of the averaged data of the working process measurement signal calculated in the first step which belong to a predetermined period in the past including the value of the averaged data at the present measurement point of time;
 a 23rd step of multiplying a maximum value, a minimum value or an average value of the averaged data obtained for a time between a point of time when a fixed time for excepting a signal variation in an initial stage of the working process elapses and another point of time when the working process measurement signal begins a great variation by different predetermined values to calculate relative values as first and second threshold values;
 an eighth step of waiting that an absolute value of the average gradient of the averaged data becomes equal to or higher than the first threshold value; and
 a ninth step of calculating a short time gradient of the averaged data of the working process measurement signal only from the value at the present measurement point of time and the value in the nearest past of the averaged data of the working process measurement signal calculated in the first step after the absolute value of the average gradient of the averaged data of the working process measurement signal calculated in the fourth step becomes equal to or higher than the first threshold value and determining that the working process has come to an end if the short time gradient reaches a value within the second threshold value successively more than a predetermined number of times, if the short time gradient assumes a value within the second threshold value totally by more than the predetermined number of times after the absolute value of the average gradient becomes equal to or higher than the first threshold value or if the ratio at which the short time gradient assumes a value within the second threshold value is equal to or higher than a predetermined ratio.

38. A working process end point real time determination method as claimed in claim 37, wherein, in the first step, the working process measurement signal is averaged after each time interval within which a working object makes one rotation.

39. A working process end point real time determination method as claimed in claim 37, wherein, in the first step, the working process measurement signal is averaged after each time interval within which a working object makes an integral number of rotations.

40. A working process end point real time determination method as claimed in claim 37, wherein, in the first step, the averaging of the working process measurement signal only over a predetermined interval of time within a time within which a working object makes one rotation is performed after each period of rotation of the working object.

41. A working process end point real time determination method as claimed in claim 37, wherein, in the first step, the working process measurement signal is averaged at time intervals within which inspection light scans a working object.

42. A working process end point real time determination method as claimed in claim 37, wherein, in the fourth step, an average value of a plurality of ones of the averaged data which belong to a predetermined period in the past including the value of the averaged data at the present measurement point of time and an average value of another plurality of ones of the averaged data which belong to another predetermined period in the further past are calculated, and a variation amount per unit time between the two average values is calculated as the average gradient.

43. A working process end point real time determination method as claimed in claim 37, wherein, in the fourth step, an expression of a straight line is determined by a least square approximation method using a plurality of averaged data of a measured light amount which belong to a predetermined period in the past including a value of the measured light amount averaged data at the present measurement point of time, and a gradient of the straight line is calculated as the average gradient.

44. A working process end point real time determination method as claimed in claim 37, wherein an average gradient in a short time including a comparatively small number of averaged data in the past is calculated and the number of times by which the average gradient in the short time assumes a value equal to or greater than 0 is counted, and it is determined that the working end point comes if the calculated end point determination time is smaller than the present working time and the count number by which the relationship that the average gradient in the short time is equal to or greater than 0 is satisfied is equal to or greater than a predetermined number.

45. A working process end point real time determination method as claimed in claim 37, wherein a predetermined time which exceeds a time within which a great variation of the averaged data in an initial stage of the working occurs is set in advance, and the predetermined time and the working elapsed time till the present are compared with each other and then the working end point determination operation is not performed until the present working elapsed time becomes equal to or greater than the predetermined time set in advance.

46. A working process end point real time determination method as claimed in claim 37, wherein a maximum value of the averaged data till the present measurement point of time is determined, and the working end point determination operation is not performed until it is determined, when the averaged data drops by a predetermined ratio from the maximum value, that a drop of the averaged data which is a characteristic of the averaged data in the proximity of the working end point has started.

47. A working process end point real time determination method as claimed in claim 37, wherein, when the end point determination time is to be calculated, a time obtained by adding or subtracting a predetermined time to or from a working time till the present since the oldest point of time in the past used for the calculation of the average gradient is subtracted from a time at which the average gradient assumes a value equal to 0 to calculate the end point determination time thereby to delay or advance the determination of the working end point by a predetermined time.

48. A working process end point real time determination method as claimed in claim 37, wherein, when it is determined that the short time gradient exhibits a value within the predetermined threshold value totally by more than the predetermined number of times after the absolute value of the average gradient exhibits a maximum value, in such a process that the absolute value of the average gradient assumes a maximum value by a plurality of times before the working process comes to an end, each time a maximum value is detected, the total number of times is reset to re-start counting.

49. A working process end point real time determination method for a CMP apparatus for performing chemical and mechanical polishing of a semiconductor wafer, comprising:

a tenth step of calculating, as measured light amount averaged data, an average value after each predetermined interval of time of a reflected light amount measured by a polished condition monitoring apparatus of the reflected light amount measurement type mounted on said CMP apparatus for irradiating inspection light upon a polished face of the semiconductor wafer and monitoring a polished condition from a variation of the reflected light amount obtained then;

an eleventh step of calculating, as average gradient data, an average rate of change over a plurality of measured light amount averaged data which belong to a predetermined period in the past including the value at the present measurement point of time of the measured light amount averaged data calculated in the tenth step;

a twelfth step of joining, after an absolute value of the average gradient of the measured light amount averaged data calculated in the eleventh step assumes a value equal to or higher than a predetermined value, the average gradient at the present measurement point of time and another one of the average gradients in the near past to perform extrapolation to the future to estimate and calculate a time at which the relationship that the average gradient is equal to 0 is reached;

a thirteenth step of subtracting a polishing time till the present since the oldest point of time in the past used for calculation of the average gradient in the eleventh step from the time at which the relationship that the average gradient is equal to 0 is reached to calculate an end point determination time; and a fourteenth step of determining a polishing end point based on the end point determination time calculated in the thirteenth step and the present polishing time.

50. A working process end point real time determination method as claimed in claim 49, wherein, in the tenth step, the reflected light amount is averaged after each time interval within which a semiconductor wafer makes one rotation.

51. A working process end point real time determination method as claimed in claim 49, wherein, in the tenth step, the reflected light amount is averaged after each time interval within which a semiconductor wafer makes an integral number of rotations.

52. A working process end point real time determination method as claimed in claim 49, wherein, in the tenth step, the averaging of the reflected light amount only over a predetermined interval of time within a time within which a semiconductor wafer makes one rotation is performed after each period of rotation of the semiconductor wafer.

53. A working process end point real time determination method as claimed in claim 49, wherein, in the tenth step, the reflected light amount is averaged at time intervals within which inspection light scans a chip on a semiconductor wafer.

54. A working process end point real time determination method as claimed in claim 49, wherein, in the eleventh step, an average value of a plurality of ones of the measured light amount averaged data which belong to a predetermined period in the past including the value of the measured light amount averaged data at the present measurement point of time and an average value of another plurality of ones of the measured light amount averaged data which belong to another predetermined period in the further past are calculated, and a variation amount per unit time between the two average values is calculated as the average gradient.

55. A working process end point real time determination method as claimed in claim 49, wherein, in the eleventh step, an expression of a straight line is determined by a least square approximation method using a plurality of measured light amount averaged data of a measured light amount which belong to a predetermined period in the past including a value of the measured light amount averaged data at the present measurement point of time, and a gradient of the straight line is calculated as the average gradient.

56. A working process end point real time determination method as claimed in claim 49, wherein, in the eleventh step, an expression of an approximate straight line is determined by a least square approximation method using a plurality of measured light amount averaged data of a measured light amount which belong to a predetermined period in the past including a value of the measured light amount averaged data at the present measurement point of time from among the measured light amount averaged data calculated in the tenth step, and a gradient of the approximate straight line is calculated as the average gradient.

57. A working process end point real time determination method as claimed in claim 49, further comprising a step of comparing, prior to the eleventh step, a predetermined time set in advance and a polishing elapsed time till the present with each other and waiting that the present polishing elapsed time becomes equal to or greater than the predetermined time set in advance.

58. A working process end point real time determination method as claimed in claim 49, further comprising a step of detecting, prior to the eleventh step, a maximum value of the measured light amount averaged data before the present point of time, calculating a ratio between the maximum value and the measured light amount averaged data at the present measurement point of time and waiting that the ratio becomes a value equal to or less than a threshold value set in advance.

59. A working process end point real time determination method as claimed in claim 49, wherein, in the twelfth step, an expression of a straight line which passes two points of the average gradient of the average gradient data at the present measurement point of time and another average gradient immediately preceding to the same is determined, and a time at which the average gradient becomes equal to 0 is calculated from the expression of the straight line only when the gradient of the straight line determined is in the positive if the measured light amount averaged data exhibits a variation with respect to time wherein the measured light amount averaged data drops by a great amount once and then enters a steady state or only when the gradient of the straight line determined is in the negative if the measured light amount averaged data exhibits another variation with respect to time wherein the measured light amount averaged data increases by a great amount once and then enters a steady state.

60. A working process end point real time determination method as claimed in claim 49, wherein, in the twelfth step, an expression of a straight line is determined by a least square approximation method using three or more average gradients of the averaged gradient data which belong to the past including the average gradient at the present measurement point of time, and a time at which the average gradient becomes equal to 0 is calculated from the expression of the straight line only when the gradient of the straight line determined is in the positive if the measured light amount averaged data exhibits a variation with respect to time wherein the measured light amount averaged data drops by a great amount once and then enters a steady state or only when the gradient of the straight line determined is in the negative if the measured light amount averaged data exhibits another variation with respect to time wherein the measured light amount averaged data increases by a great amount once and then enters a steady state.

61. A working process end point real time determination method as claimed in claim 49, wherein, in the twelfth step, an expression of a straight line which passes two points of the average gradient at the present measurement point of time and another average gradient immediately preceding to the same is determined, and a time at which the average gradient becomes equal to 0 is calculated from the expression of the straight line when the gradient of the straight line determined is in the positive.

62. A working process end point real time determination method as claimed in claim 49, wherein, in the thirteenth step, a time obtained by adding or subtracting a predetermined time to or from a polishing time till the present since the oldest point of time in the past used for the calculation of the average gradient is subtracted from a time at which the average gradient assumes a value equal to 0 to calculate the end point determination time.

63. A working process end point real time determination method as claimed in claim 49, wherein, in the thirteenth step, a point of time at which the end point determination time becomes a polishing time at present is determined as the polishing end point.

64. A working process end point real time determination method as claimed in claim 49, wherein an average gradient in a short time including a comparatively small number of measured light amount averaged data in the past is calculated and the number of times by which the average gradient in the short time assumes a value equal to or greater than 0 is counted, and it is determined that the polishing end point comes if the calculated end point determination time is smaller than the present polishing time and the count number by which the relationship that the average gradient in the short time is equal to or greater than 0 is satisfied is equal to or greater than a predetermined number.

65. A working process end point real time determination method as claimed in claim 49, wherein a predetermined time which exceeds a time within which a great variation of the measured light amount averaged data in an initial stage of the polishing occurs is set in advance, and the predetermined time and the polishing elapsed time till the present are compared with each other and then the polishing end point determination operation is not performed until the present polishing elapsed time becomes equal to or greater than the predetermined time set in advance.

66. A working process end point real time determination method as claimed in claim 49, wherein a maximum value of the measured light amount averaged data till the present measurement point of time is determined, and the polishing end point determination operation is not performed until it is determined, when the measured light amount averaged data drops by a predetermined ratio from the maximum value, that a drop of the measured light amount averaged data which is a characteristic of the measured light amount averaged data in the proximity of the polishing end point has started.

67. A working process end point real time determination method as claimed in claim 49, wherein, when the end point determination time is to be calculated, a time obtained by adding or subtracting a predetermined time to or from a polishing time till the present since the oldest point of time in the past used for the calculation of the average gradient is subtracted from a time at which the average gradient assumes a value equal to 0 to calculate the end point determination time thereby to delay or advance the determination of the polishing end point by a predetermined time.

68. A working process end point real time determination method as claimed in claim 49, wherein, after the average gradient data to be used for the estimation by the extrapolation of the end point determination time assumes a minimum value, an average gradient in a short time including a comparatively small number of measured light amount averaged data in the past is calculated and the number of times by which the average gradient in the short time assumes a value within a predetermined threshold value is counted, and it is determined that the polishing end point comes if the calculated end point determination time is smaller than the present polishing time and the count number by which the relationship that the average gradient in the short time is equal to or greater than the predetermined threshold value is satisfied is equal to or greater than a predetermined number.

69. A working process end point real time determination method as claimed in claim 68, wherein second threshold values to be used for determination of whether or not the average gradient in the short time should be counted are provided and given as relative values obtained by multiplying a maximum value, a minimum value or an average value of the measured light amount averaged data obtained for a time between a point of time when a fixed time for excepting a signal variation in an initial stage of the polishing elapses and another point of time when the measured light amount averaged data begins to drop by a great amount by different predetermined values.

70. A working process end point real time determination method as claimed in claim 68, wherein a second threshold value to be used for determination of whether or not the average gradient in the short time should be counted is provided and given as a fixed value.

71. A working process end point real time determination method as claimed in claim 68, wherein, when the number of times by which the average gradient in the short time assumes a value equal to or higher than the predetermined threshold value is counted, if the average gradient data to be used for the estimation by the extrapolation of the end point determination time assumes a maximum value by a plurality of times before the polishing process comes to an end, each time a maximum value is detected, the total number of times is reset to re-start counting.

72. A working process end point real time determination method as claimed in claim 49, wherein a predetermined time which exceeds a time within which a great variation of the measured light amount averaged data in an initial stage of the polishing occurs is set in advance, and the predetermined time and the polishing elapsed time till the present are compared with each other and then the polishing end point determination operation is not performed until the present polishing elapsed time becomes equal to or greater than the predetermined time set in advance.

73. A working process end point real time determination method as claimed in claim 49, wherein a maximum value of the measured light amount averaged data till the present measurement point of time is determined, and the polishing end point determination operation is not performed until it is determined, when the measured light amount averaged data drops by a predetermined ratio from the maximum value, that a drop of the measured light amount averaged data which is a characteristic of the measured light amount averaged data in the proximity of the polishing end point has started.

74. A working process end point real time determination method, comprising:

a tenth step of calculating, as measured light amount averaged data, an average value after each predetermined interval of time of a reflected light amount measured by a polished condition monitoring apparatus mounted on a CMP apparatus for performing chemical and mechanical polishing of a semiconductor wafer;

an eleventh step of calculating, as average gradient data, an average rate of change over a plurality of measured light amount averaged data which belong to a predetermined period in the past including the value at the present measurement point of time of the measured light amount averaged data calculated in the tenth step;

a twelfth step of joining, after an absolute value of the average gradient of the measured light amount averaged data calculated in the eleventh step assumes a value equal to or higher than a predetermined value, the average gradient at the present measurement point of time and another one of the average gradients in the near past to perform extrapolation to the future to estimate and calculate a time at which the relationship that the average gradient is equal to 0 is reached;

a thirteenth step of subtracting a polishing time till the present since the oldest point of time in the past used for calculation of the average gradient in the eleventh step from the time at which the relationship that the average gradient is equal to 0 is reached to calculate an end point determination time;

a 31st step of multiplying a maximum value or an average value of the measured light amount averaged data obtained for a time after a fixed time for excepting a signal variation in an initial stage of the polishing elapses until the measured light amount averaged data begins to drop a great amount by a predetermined value to calculate a relative value as a threshold value;

a 32nd step of calculating a first average value of a plurality of ones of the measured light amount averaged data which belong to a predetermined period in the past including the value of the measured light amount averaged data at the present measurement point of time and a second average value of another plurality of ones of the measured light amount averaged data which belong to another predetermined period in the further past and calculating a variation amount per unit time between the first and second average values as an average gradient in a short time;

a 33rd step of detecting that the average gradient data calculated in the eleventh step assumes a minimum value;

a 34th step of counting an accumulated value of the number of times by which the average gradient data in the short time calculated in the 32nd step assumes a value equal to or higher than the counter threshold value after it is determined that the average gradient data calculated in the eleventh step assumes a minimum value;

a 35th step of resetting, if the average gradient data calculated in the eleventh step assumes a maximum value after it is determined in the 33rd step that the average gradient data assumes a minimum value, the accumulated value counted in the 34th step and repeating the minimum value detection in the 33rd step; and a 36th step of comparing the end point determination time and the present polishing time with each other and determining that the polishing end time comes if the end point determination time is equal to or smaller than the present polishing time and the number of times by which the average gradient in the short time counted becomes within the predetermined threshold value is equal to or greater than a predetermined number.

* * * * *